(12) United States Patent
Casparian et al.

(10) Patent No.: US 9,343,248 B2
(45) Date of Patent: May 17, 2016

(54) SYSTEMS AND METHODS FOR IMPLEMENTING SPRING LOADED MECHANICAL KEY SWITCHES WITH VARIABLE DISPLACEMENT SENSING

(71) Applicants: Mark A. Casparian, Miami, FL (US); Frank C. Azor, Palmetto Bay, FL (US); Joe A. Olmsted, Austin, TX (US)

(72) Inventors: Mark A. Casparian, Miami, FL (US); Frank C. Azor, Palmetto Bay, FL (US); Joe A. Olmsted, Austin, TX (US)

(73) Assignee: Dell Products LP, Round Rock, TX (US)

( * ) Notice: Subject to any disclaimer, the term of this patent is extended or adjusted under 35 U.S.C. 154(b) by 179 days.

(21) Appl. No.: 14/013,724

(22) Filed: Aug. 29, 2013

(65) Prior Publication Data
US 2015/0061902 A1   Mar. 5, 2015

(51) Int. Cl.
| | |
|---|---|
| *H03K 17/94* | (2006.01) |
| *H01H 13/7073* | (2006.01) |
| *G06F 3/02* | (2006.01) |
| *H03K 17/965* | (2006.01) |
| *H01H 13/83* | (2006.01) |

(52) U.S. Cl.
CPC ......... *H01H 13/7073* (2013.01); *G06F 3/0202* (2013.01); *G06F 3/0227* (2013.01); *H03K 17/965* (2013.01); *H01H 13/83* (2013.01); *H01H 2235/00* (2013.01); *H01H 2239/006* (2013.01); *H01H 2239/022* (2013.01); *H01H 2239/024* (2013.01)

(58) Field of Classification Search
CPC .......... H03K 17/965; H01H 2239/006; H01H 2239/024; H01H 13/83; H01H 2235/00; H01H 2239/022; H01H 13/7073; G06F 3/0227; G06F 3/0202
See application file for complete search history.

(56) References Cited

U.S. PATENT DOCUMENTS

| | | | |
|---|---|---|---|
| 3,786,429 A | 1/1974 | Goldman et al. | |
| 3,936,674 A | 2/1976 | Hughes | |
| 4,291,201 A | 9/1981 | Johnson et al. | |
| 4,302,011 A | 11/1981 | Pepper, Jr. | |
| 4,303,811 A | 12/1981 | Parkinson | |
| 4,334,134 A | 6/1982 | Janda | |
| 4,449,024 A | 5/1984 | Stracener | |
| 4,527,250 A | 7/1985 | Galdun et al. | |
| 4,628,785 A | 12/1986 | Buchia | |
| 4,660,019 A * | 4/1987 | Bauer | H01H 9/061 200/522 |
| 4,733,590 A | 3/1988 | Watanabe | |
| 4,849,852 A | 7/1989 | Mullins | |
| 4,850,591 A | 7/1989 | Takezawa et al. | |
| 4,896,069 A | 1/1990 | Rosenberg et al. | |

(Continued)

OTHER PUBLICATIONS

Casparian et al., "Systems and Methods for Implementing Haptics for Pressure Sensitive Keyboards", U.S. Appl. No. 14/044,331, filed Oct. 2, 2013, Response to Office Action filed Dec. 23, 2014, 29 pgs.

(Continued)

*Primary Examiner* — Ojiako Nwugo
(74) *Attorney, Agent, or Firm* — Egan, Peterman, Enders & Huston LLP

(57) ABSTRACT

Systems and methods are disclosed that enable spring loaded mechanical key switch assemblies having variable displacement sensing capabilities. In one example, the disclosed key switch assemblies may be implemented in a keyboard system and used for providing variable displacement output signals that may be processed by a controller for input to a host processing device of an information handling system, such as a desktop or notebook computer. In another example, the disclosed key switch assemblies may be configured to provide both a digital "make" connection signal and separate variable displacement output signal/s that may be processed for input to a host processing device of an information handling system.

29 Claims, 10 Drawing Sheets

(56) References Cited

U.S. PATENT DOCUMENTS

| | | | |
|---|---|---|---|
| 4,899,631 A * | 2/1990 | Baker | G10H 1/053 84/433 |
| 4,977,298 A | 12/1990 | Fujiyama | |
| 5,220,318 A | 6/1993 | Staley | |
| 5,252,798 A | 10/1993 | Kamada | |
| 5,285,037 A | 2/1994 | Baranski et al. | |
| 5,389,757 A * | 2/1995 | Souliere | H01H 13/705 200/345 |
| 5,408,060 A | 4/1995 | Muurinen | |
| 5,434,566 A | 7/1995 | Iwasa et al. | |
| 5,450,078 A | 9/1995 | Silva et al. | |
| 5,508,719 A | 4/1996 | Gervais | |
| 5,512,722 A * | 4/1996 | Ozeki | H01H 13/705 200/290 |
| 5,646,587 A * | 7/1997 | Miyazawa | H03K 17/97 335/205 |
| 5,691,716 A | 11/1997 | Crowley | |
| 5,736,976 A | 4/1998 | Cheung | |
| 5,909,211 A | 6/1999 | Combs et al. | |
| 6,007,209 A | 12/1999 | Pelka | |
| 6,102,802 A | 8/2000 | Armstrong | |
| 6,135,886 A | 10/2000 | Armstrong | |
| 6,275,138 B1 | 8/2001 | Maeda | |
| 6,313,762 B1 | 11/2001 | Crowley | |
| 6,400,285 B1 | 6/2002 | Gifford | |
| 6,417,845 B1 | 7/2002 | Chen et al. | |
| 6,559,399 B2 | 5/2003 | Hsu et al. | |
| 6,563,434 B1 | 5/2003 | Olodort et al. | |
| 6,608,271 B2 | 8/2003 | Duarte | |
| 6,617,982 B1 | 9/2003 | Ogata et al. | |
| 6,684,166 B2 | 1/2004 | Bellwood et al. | |
| 6,747,226 B2 | 6/2004 | Watanabe | |
| 6,747,867 B2 | 6/2004 | Hsu | |
| 6,758,615 B2 | 7/2004 | Monney et al. | |
| 6,860,612 B2 | 3/2005 | Chiang et al. | |
| 6,882,291 B2 | 4/2005 | Ogata et al. | |
| 6,883,985 B2 | 4/2005 | Roberson | |
| 6,885,364 B1 | 4/2005 | Ogata et al. | |
| 6,918,677 B2 | 7/2005 | Shipman | |
| 7,059,790 B2 | 6/2006 | Risheq | |
| 7,064,682 B2 | 6/2006 | Fedigan | |
| 7,084,787 B2 | 8/2006 | Olodort et al. | |
| 7,106,305 B2 | 9/2006 | Rosenberg | |
| 7,123,241 B2 | 10/2006 | Bathiche | |
| 7,129,854 B2 | 10/2006 | Arneson et al. | |
| 7,196,640 B2 | 3/2007 | Fedigan | |
| 7,244,898 B2 | 7/2007 | Kim | |
| 7,256,768 B2 | 8/2007 | Bathiche | |
| 7,335,844 B2 | 2/2008 | Lee et al. | |
| 7,394,033 B2 | 7/2008 | Kim | |
| 7,541,946 B2 | 6/2009 | Fedigan | |
| 7,655,901 B2 | 2/2010 | Idzik et al. | |
| 7,667,371 B2 | 2/2010 | Sadler et al. | |
| 7,688,310 B2 | 3/2010 | Rosenberg | |
| 7,741,979 B2 | 6/2010 | Schlosser et al. | |
| 7,772,987 B2 | 8/2010 | Shows | |
| 7,786,395 B2 | 8/2010 | Ozias et al. | |
| 8,159,461 B2 | 4/2012 | Martin et al. | |
| 8,217,892 B2 | 7/2012 | Meadors | |
| 8,224,391 B2 | 7/2012 | Kim et al. | |
| 8,307,222 B2 | 11/2012 | Wang et al. | |
| 8,411,029 B2 | 4/2013 | Casparian et al. | |
| 8,502,094 B2 | 8/2013 | Chen | |
| 8,760,273 B2 | 6/2014 | Casparian et al. | |
| 2002/0021285 A1 | 2/2002 | Leman | |
| 2002/0070921 A1 | 6/2002 | Feldman | |
| 2002/0084721 A1 | 7/2002 | Walczak | |
| 2002/0109613 A1 | 8/2002 | Crowley et al. | |
| 2003/0072595 A1 | 4/2003 | Al-Safar | |
| 2003/0122779 A1 | 7/2003 | Martin et al. | |
| 2003/0210233 A1 | 11/2003 | Frulla | |
| 2004/0027385 A1 | 2/2004 | Rekimoto et al. | |
| 2004/0104893 A1 | 6/2004 | Huang | |
| 2004/0174200 A1 | 9/2004 | McNutt | |
| 2004/0183783 A1 | 9/2004 | Rojas et al. | |
| 2004/0246149 A1 | 12/2004 | Fedigan | |
| 2005/0057514 A1 | 3/2005 | Bathiche | |
| 2005/0057515 A1 | 3/2005 | Bathiche | |
| 2005/0058492 A1 | 3/2005 | Hirsch | |
| 2005/0073446 A1 | 4/2005 | Lazaridis et al. | |
| 2005/0083215 A1 | 4/2005 | Crowley et al. | |
| 2005/0104751 A1 | 5/2005 | Tsai et al. | |
| 2005/0168447 A1 | 8/2005 | Caine et al. | |
| 2005/0174260 A1 | 8/2005 | Arneson et al. | |
| 2006/0022951 A1 | 2/2006 | Hull | |
| 2006/0066570 A1 | 3/2006 | Trifilo | |
| 2006/0148564 A1 | 7/2006 | Herkelman | |
| 2006/0158275 A1 | 7/2006 | Fedigan | |
| 2006/0227015 A1 | 10/2006 | Fedigan | |
| 2006/0255971 A1 | 11/2006 | Kim | |
| 2006/0277466 A1 | 12/2006 | Anderson | |
| 2007/0065215 A1 | 3/2007 | Brown | |
| 2007/0227256 A1 | 10/2007 | Wright | |
| 2007/0229455 A1 | 10/2007 | Martin et al. | |
| 2007/0235307 A1 | 10/2007 | Liao et al. | |
| 2007/0285393 A1 | 12/2007 | Ishakov | |
| 2008/0001787 A1 | 1/2008 | Smith et al. | |
| 2008/0018200 A1 | 1/2008 | Vogeley et al. | |
| 2008/0024454 A1 | 1/2008 | Everest | |
| 2008/0092087 A1 | 4/2008 | Brown et al. | |
| 2008/0144333 A1 | 6/2008 | Gourlay | |
| 2008/0159799 A1 | 7/2008 | Bender et al. | |
| 2008/0179172 A1 | 7/2008 | Sellers | |
| 2008/0251364 A1 | 10/2008 | Takala et al. | |
| 2008/0309631 A1 | 12/2008 | Westerman et al. | |
| 2009/0002201 A1 | 1/2009 | Crowley et al. | |
| 2009/0007758 A1 | 1/2009 | Schlosser et al. | |
| 2009/0079612 A1 | 3/2009 | Parfitt | |
| 2009/0127084 A1 | 5/2009 | Ozias et al. | |
| 2009/0140985 A1 | 6/2009 | Liu | |
| 2009/0178913 A1 | 7/2009 | Peterson et al. | |
| 2009/0189790 A1 | 7/2009 | Peterson et al. | |
| 2009/0189873 A1 | 7/2009 | Peterson et al. | |
| 2009/0207055 A1 | 8/2009 | Aull et al. | |
| 2009/0210568 A1 | 8/2009 | Peterson et al. | |
| 2009/0267892 A1 | 10/2009 | Faubert | |
| 2009/0267920 A1 | 10/2009 | Faubert et al. | |
| 2009/0278792 A1 | 11/2009 | Toebes et al. | |
| 2010/0027854 A1 | 2/2010 | Chatterjee et al. | |
| 2010/0040400 A1 | 2/2010 | Hirsch | |
| 2010/0089735 A1 | 4/2010 | Takeda et al. | |
| 2010/0090813 A1 | 4/2010 | Je et al. | |
| 2010/0090814 A1 | 4/2010 | Cybart et al. | |
| 2010/0090957 A1 | 4/2010 | Idzik et al. | |
| 2010/0117809 A1 | 5/2010 | Dai et al. | |
| 2010/0134420 A1 * | 6/2010 | Gluckstad | G06F 3/0238 345/172 |
| 2010/0148999 A1 | 6/2010 | Casparian et al. | |
| 2010/0182241 A1 | 7/2010 | Rosenberg | |
| 2010/0205803 A1 | 8/2010 | Lipton et al. | |
| 2010/0252407 A1 | 10/2010 | Merminod et al. | |
| 2010/0253552 A1 | 10/2010 | Mendez et al. | |
| 2010/0288607 A1 | 11/2010 | Ozias et al. | |
| 2010/0321301 A1 | 12/2010 | Casparian et al. | |
| 2011/0078470 A1 | 3/2011 | Wang et al. | |
| 2011/0095877 A1 | 4/2011 | Casparian et al. | |
| 2011/0102325 A1 | 5/2011 | Sato et al. | |
| 2011/0102326 A1 | 5/2011 | Casparian et al. | |
| 2011/0102340 A1 | 5/2011 | Martin et al. | |
| 2011/0285555 A1 | 11/2011 | Bocirnea | |
| 2012/0298491 A1 | 11/2012 | Ozias et al. | |
| 2013/0067126 A1 | 3/2013 | Casparian et al. | |
| 2013/0100028 A1 | 4/2013 | Mahowald et al. | |
| 2013/0178292 A1 | 7/2013 | Casparian et al. | |
| 2014/0105664 A1 | 4/2014 | Hoyos | |
| 2014/0226302 A1 | 8/2014 | Shih et al. | |
| 2014/0253454 A1 | 9/2014 | Caldwell | |
| 2015/0061901 A1 | 3/2015 | Casparian et al. | |
| 2015/0061902 A1 | 3/2015 | Casparian et al. | |

OTHER PUBLICATIONS

Casparian et al., "Systems and Methods for Implementing Haptics for Pressure Sensitive Keyboards", U.S. Appl. No. 14/044,331, filed

(56) References Cited

OTHER PUBLICATIONS

Oct. 2, 2013, DELL:132C1, Advisory Action mailed Aug. 6, 2015, 8 pgs.
Casparian et al., "Systems and Methods for Implementing Haptics for Pressure Sensitive Keyboards", U.S. Appl. No. 14/044,331, filed Oct. 2, 2013, DELL:132C1, Amendment filed Aug. 24, 2015, 29 pgs.
Casparian et al., "Systems and Methods for Implementing Haptics for Pressure Sensitive Keyboards", DELL:132C1; U.S. Appl. No. 14/044,331, filed Oct. 2, 2013, 87 pgs.
Casparian et al., "Systems and Methods for Implementing a Multi Function Mode for Pressure Sensitive Sensors and Keyboards", DELL:143, U.S. Appl. No. 13/232,707, filed Sep. 14, 2011, Amendment, Nov. 26, 2013, 19 pgs.
Casparian et al., "Systems and Methods for Implementing Haptics for Pressure Sensitive Keyboards", DELL:132C1; U.S. Appl. No. 14/044,331, filed Oct. 2, 2013, Preliminary Amendment; 22 pgs.
Texas Instruments, "MSP430 Capacitive Single-Touch Sensor Design Guide", Application report, SLAA379, Jan. 2008, 19 pgs.
Cypress Semiconductor Corporation, Cypress Perform, "*CY8C21634, CY8C21534, CY8C21434, CY8C21334, CY8C2123; PSoC® Mixed-Signal Array*," Apr. 18, 2008, Document No. 38-12025 Rev. M, 43 pgs.
Logitech, "Logitech Gaming Keyboard G510", Printed from Internet Aug. 25, 2011, 3 pgs.
Saitek, "Saitek Pro Gamer Command Unit", Feb. 27, 2011, 7 pgs.
Saitek, "Saitek Pro Gamer Command Unit", Dec. 6, 2005, 41 pgs.
Casparian et al., Keyboard With User Configurable Granularity Scales for Pressure Sensitive Keys, DELL:111, U.S. Appl. No. 12/316,703, Office Action, Feb. 27, 2012; 13 pgs.
Casparian et al., Keyboard With User Configurable Granularity Scales for Pressure Sensitive Keys, DELL:111, U.S. Appl. No. 12/316,703, Response, May 29, 2012; 15 pgs.
Casparian et al., Keyboard With User Configurable Granularity Scales for Pressure Sensitive Keys, DELL:111, U.S. Appl. No. 12/316,703, Final Office Action, Aug. 2, 2012; 22 pgs.
Casparian et al., "Systems and Methods for Implementing Haptics for Pressure Sensitive Keyboards", DELL:132, U.S. Appl. No. 12/930,125, Office Action, Aug. 9, 2012; 16 pgs.
Casparian et al., "Systems and Methods for Implementing Pressure Sensitive Keyboards", DELL:124, U.S. Appl. No. 12/802,468, Office Action, Oct. 23, 2012; 14 pgs.
Casparian et al., "Keyboard With User Configurable Granularity Scales for Pressure Sensitive Keys", DELL:111, U.S. Appl. No. 12/316,703, RCE and Amendment, Nov. 2, 2012, 19 pgs.
Casparian et al., "Systems and Methods for Implementing Haptics for Pressure Sensitive Keyboards", DELL:132, U.S. Appl. No. 12/930,125, Response to Office Action, Nov. 9, 2012; 23 pgs.
Casparian et al., "Systems and Methods for Implementing Haptics for Pressure Sensitive Keyboards", DELL:132, U.S. Appl. No. 12/930,125, Final Office Action, Jan. 2, 2013; 22 pgs.
Casparian et al., "Systems and Methods for Implementing Pressure Sensitive Keyboards", DELL:124, U.S. Appl. No. 12/802,468, Amendment, Jan. 23, 2013, 17 pgs.
Casparian et al., "Systems and Methods for Implementing Haptics for Pressure Sensitive Keyboards", DELL:132, U.S. Appl. No. 12/930,125, Amendment, Mar. 1, 2013, 26 pgs.
Casparian et al., "Systems and Methods for Implementing Haptics for Pressure Sensitive Keyboards", DELL:132, U.S. Appl. No. 12/930,125, Advisory Action, Apr. 3, 2013, 9 pgs.
Casparian et al., "Systems and Methods for Implementing Pressure Sensitive Keyboards", DELL:124, U.S. Appl. No. 12/802,468, Final Office Action, Apr. 9, 2013, 21 pgs.
Casparian et al., "Systems and Methods for Implementing Pressure Sensitive Keyboards", DELL:124, U.S. Appl. No. 12/802,468, Response to Final Office Action, Jun. 10, 2013, 13 pgs.
Casparian et al., "Systems and Methods for Implementing Pressure Sensitive Keyboards", DELL:124, U.S. Appl. No. 12/802,468, Advisory Action, Jul. 11, 2013, 7 pgs.
Casparian et al., "Systems and Methods for Implementing Pressure Sensitive Keyboards", DELL:124, U.S. Appl. No. 12/802,468, filed Jun. 8, 2010, RCE and Amendment, Aug. 12, 2013, 25 pgs.
Cherry Corporation, MX Series Key Switch, Obtained From Internet Aug. 12, 2013, 9 pgs.
Cherry Corporation, Keymodule MX, Obtained from Internet Jul. 25, 2013, 2 pgs.
The Keyboard Company, An Introduction to Cherry MX Mechanical Switches, Obtained from Internet Jul. 25, 2013, 7 pgs.
Zhang et al., Systems and Methods for Intelligent System Profile Unique Data Management:, DELL:152, U.S. Appl. No. 13/618,666, filed Sep. 14, 2012, 32 pgs.
Casparian et al., "Systems and Methods for Lighting Spring Loaded Mechanical Key Switches", DELL:169, U.S. Appl. No. 14/013,603, filed Aug. 29, 2013, 50 pgs.
Casparian et al., "Apparatus and Methods for Mounting Haptics Actuation Circuitry in Keyboards", DELL:133; U.S. Appl. No. 12/930,118, filed Dec. 29, 2010, Office Action, Oct. 4, 2013, 21 pgs.
Casparian et al., "Systems and Methods for Implementing a Multi Function Mode for Pressure Sensitive Sensors and Keyboards", DELL:143, U.S. Appl. No. 13/232,707, filed Sep. 14, 2011, Office Action, Jul. 29, 2013, 15 pgs.
Casparian et al., "Systems and Methods for Implementing Haptics for Pressure Sensitive Keyboards", U.S. Appl. No. 14/404,331, filed Oct. 2, 2013, Office Action dated Apr. 22, 2015, 68 pgs.
Casparian et al., "Systems and Methods for Implementing Haptics for Pressure Sensitive Keyboards", DELL:132C1; U.S. Appl. No. 14/044,331, filed Oct. 2, 2013, Third Preliminary Amendment; Dec. 16, 2013, 23 pgs.
Casparian et al., "Apparatus and Methods for Mounting Haptics Actuation Circuitry in Keyboards", DELL:133, U.S. Appl. No. 12/930,118, filed Dec. 29, 2010, Amendment, Dec. 27, 2013, 19 pgs.
Casparian et al., "Systems and Methods for Implementing Haptics for Pressure Sensitive Keyboards", DELL:132, U.S. Appl. No. 12/930,125, filed Dec. 29, 2010, Amendment, Dec. 27, 2013, 23 pgs.
Casparian et al., "Keyboard With User Configurable Granularity Scales for Pressure Sensitive Keys", U.S. Appl. No. 12/316,703, filed Dec. 16, 2008, Office Action dated Nov. 10, 2014, 29 pgs.
Casparian et al., "Systems and Methods for Implementing Haptics for Pressure Sensitive Keyboards", U.S. Appl. No. 14/044,331, filed Oct. 2, 2013, Office Action dated Sep. 29, 2014, 58 pgs.
Casparian et al., "Keyboard With User Configurable Granularity Scales for Pressure Sensitive Keys", U.S. Appl. No. 12/316,703, filed Dec. 16, 2008, Response to Office Action dated Feb. 10, 2015, 22 pgs.
Casparian et al., "Keyboard With User Configurable Granularity Scales for Pressure Sensitive Keys", U.S. Appl. No. 12/316,703, filed Dec. 16, 2008, Response to Office Action dated Jul. 23, 2014, 19 pgs.
Casparian et al., "Keyboard With User Configurable Granularity Scales for Pressure Sensitive Keys", U.S. Appl. No. 12/316,703, filed Dec. 16, 2008, Final office action dated May 27, 2015, 34 pgs.
Casparian et al., "Systems and Methods for Lighting Spring Loaded Mechanical Key Switches", U.S. Appl. No. 14/013,603, filed Aug. 29, 2013, DELL:169, Office Action mailed Sep. 14, 2015, 23 pgs.
Casparian et al., "Systems and Methods for Lighting Spring Loaded Mechanical Key Switches", U.S. Appl. No. 14/013,603, filed Aug. 29, 2013, DELL:169, Response to Office Action filed Dec. 14, 2015, 22 pgs.
Casparian et al., "Keyboard With User Configurable Granularity Scales for Pressure Sensitive Keys", U.S. Appl. No. 12/316,703, filed Dec. 16, 2008, Response to Final office action filed Jul. 27, 2015, 11 pgs.
Casparian et al., "Systems and Methods for Implementing Haptics for Pressure Sensitive Keyboards", U.S. Appl. No. 14/404,331, filed Oct. 2, 2013, Response to Office Action dated Jul. 22, 2015, 26 pgs.
Casparian et al., "Keyboard With User Configurable Granularity Scales for Pressure Sensitive Keys", U.S. Appl. No. 12/316,703, filed Dec. 16, 2008, Office Action dated Apr. 23, 2014, 29 pgs.

* cited by examiner

SYSTEMS AND METHODS FOR IMPLEMENTING SPRING LOADED MECHANICAL KEY SWITCHES WITH VARIABLE DISPLACEMENT SENSING

RELATED APPLICATIONS

The present application is related in subject matter to concurrently filed patent application Ser. No. 14/013,603 entitled "SYSTEMS AND METHODS FOR LIGHTING SPRING LOADED MECHANICAL KEY SWITCHES" by Casparian et al., which is incorporated herein by reference in its entirety.

FIELD OF THE INVENTION

This invention relates generally to information handling systems and, more particularly, to spring loaded mechanical key switches having variable displacement sensing capability.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Keyboards using spring loaded mechanical key switches are popular input devices for information handling systems, such as desktop and notebook computers. Keyboards that employ spring loaded mechanical key switches are particularly popular among users of gaming applications, such as PC Gamers. Examples of conventional mechanical key switches that are employed in keyboards include Cherry MX Key Switches available from ZF Electronic Systems of Pleasant Prairie, Wis. These keys are spring-loaded and provide continuous tension throughout a downward key stroke, which has a total travel length of approximately 4 millimeters. The "make" connection for the mechanical switch is made at approximately the 2 millimeter downward key travel position (i.e., 50% downward travel). With a spring in place beneath the key, there is always tension on the user's finger throughout the downward key stroke. After the "make" connection is made, no further electrical signals are created as the key travels further downward a distance of another 2 millimeters as the user continues to apply more downward pressure to the key.

Other types of information handling system keyboards include dome switch keyboards that do not employ a mechanical switch but instead employs a rubber-dome that overlies two electrically separated conductive layers at each key location. When a key is pressed by a user, the rubber dome contacts and compresses the two conductive layers together to cause an electrical connection to be made between the two conductive layers at the key location. The occurrence of this electrical connection creates a digital signal that is provided to a keyboard controller to indicate that the particular key location has been pressed by the user. QWERTY style dome switch keyboards have been backlit using 10 to 12 edge mounted light emitting diodes (RGB or single color LEDs) that illuminate a polycarbonate light spreader layer located under and oriented parallel to the conductive layers of the dome switch keyboard. Light emanates from the side surface of the light spreader and shines up in free space and through the intervening light-transmissive conductive layers of the keyboard to backlight the keys which have light-transmissive characters that are laser-etched into the keycaps.

SUMMARY OF THE INVENTION

Disclosed herein are systems and methods that may be implemented to provide spring loaded mechanical key switches having variable displacement sensing and reporting capabilities.

In one embodiment, such variable displacement sensing spring loaded mechanical key switches may be advantageously implemented as individual variable displacement key switches of a keyboard for providing variable displacement output signals that may be processed by a controller for input to a host processing device of an information handling system, such as a desktop or notebook computer. In a further embodiment, such a keyboard may be optimized or otherwise employed by a user for gaming applications, such as PC games that execute on an information handling system. In a further embodiment, the processed variable displacement output signals may be utilized by an information handling system as a proxy for (or indication of) the amount of pressure applied by a user to a key switch of a keyboard, e.g., for purposes of software applications and other software and/or firmware that utilize relative pressure (and/or absolute amount of pressure) applied by a user to a keyboard key as a variable input signal.

In one particular implementation, a variable displacement sensing spring loaded mechanical key switch may be configured to provide both a single digital "make" connection signal (e.g., a single digital on/off signal occurring at about a 50% downward travel of the keystroke), and a separate variable displacement output signal/s (e.g., as one or more analog output signals that are representative of amount of downward displacement currently being applied to the given key), each of which may be processed for input to host processing device of an information handling system such as desktop or notebook computer However, it will be understood that a variable pressure sensing spring loaded mechanical key switch may alternatively be configured to provide only variable displacement output signal/s, and without providing a separate digital on/off output signal. Either way, a spring loaded mechanical key switch may be provided that supports both a spring-loaded key feel and variable displacement sensing capability.

Also, disclosed herein are systems and methods that may be implemented in one embodiment to provide key cap lighting to a spring loaded mechanical key switch (e.g., via a light pipe) without requiring a chassis housing of the mechanical key switch to include a dedicated power-consuming light source (e.g., such as a light emitting diode "LED") mounted to or otherwise positioned at the location of the individual key switch chassis housing. In a further embodiment, one or more common power-consuming light source/s (e.g., such as one or common LEDs) may be employed to simultaneously provide key cap lighting to multiple spring loaded mechanical key switches without requiring a dedicated power-consuming light source mounted to or otherwise positioned at the chassis housing location of any of the individual spring loaded key switches, e.g., by feeding light to each key cap though a common light spreader and through an individual non-power consuming light pipe provided for each key switch.

Using the disclosed key cap lighting systems and methods, large savings in keyboard power consumption and decreased keyboard assembly complexity may be achieved for keyboards having multiple spring loaded mechanical key switches by employing a non-power consuming light source (e.g., light pipe) to light each key switch cap rather than using a separate power-consuming light source (e.g., such as a LED) mounted into or at the location of each separate key switch chassis housing. In this regard, overall keyboard power consumption may be reduced because the number of common power-consuming light sources that are employed to light a given number of spring loaded mechanical key switches of a keyboard may be less than the total number of lighted mechanical key switches present in the keyboard. Thus, in one exemplary embodiment, it is possible that USB power from an information handling system may be sufficient alone to light multiple (or all) spring loaded mechanical key switch caps of a keyboard (e.g., such as QWERTY keyboard) without requiring use of an AC/DC adapter which would otherwise be required if separate power consuming light switches were required to be present at each key switch. Moreover, the total number of power traces on the keyboard PCB, the total number of individual power consuming light sources in the keyboard, and the number of pins provided on each spring loaded key switch chassis may also be advantageously reduced, saving assembly cost and complexity.

In one respect, disclosed herein is a keyboard system, including one or more spring loaded mechanical key switch assemblies. Each of the key switch assemblies may itself include: a key switch housing having a first end and a second end; a depressable key component movably received within the key switch chassis housing and having a first end and a second end, the first end of the depressable key component being movable between an extended position and a depressed position relative to the first end of the key switch housing with the first end of the depressable key component being closer to the first end of the key switch housing in the depressed position than in the extended position; a spring element configured to provide a resilient force to resist downward movement of the depressable key component from the extended position to the depressed position; and variable displacement-sensing circuitry configured to detect displacement of the depressable key component relative to the key switch housing and to provide one or more variable displacement signals that vary in character based on the amount of displacement of the depressable key component between the extended position and the depressed position. The keyboard system may further include displacement measurement circuitry coupled to receive the variable displacement signals and to determine in real time the relative displacement of the depressable key component between the extended position and the depressed position based on the character of the provided variable displacement signals.

In another respect, disclosed herein is a spring loaded mechanical key switch assembly that include: a key switch housing having a first end and a second end; a depressable key component movably received within the key switch chassis housing and having a first end and a second end, the first end of the depressable key component being movable between an extended position and a depressed position relative to the first end of the key switch housing with the first end of the depressable key component being closer to the first end of the key switch housing in the depressed position than in the extended position; a spring element configured to provide a resilient force to resist downward movement of the depressable key component from the extended position to the depressed position; and variable displacement-sensing circuitry configured to detect displacement of the depressable key component relative to the key switch housing and to provide one or more variable displacement signals that vary in character based on the amount of displacement of the depressable key component between the extended position and the depressed position.

In another respect, disclosed herein is a method of operating one or more key switch assemblies, including providing one or more spring loaded mechanical key switch assemblies. Each of the provided key switch assemblies may include: a key switch housing having a first end and a second end; a depressable key component movably received within the key switch chassis housing and having a first end and a second end; the first end of the depressable key component being movable between an extended position and a depressed position relative to the first end of the key switch housing with the first end of the depressable key component being closer to the first end of the key switch housing in the depressed position than in the extended position; a spring element configured to provide a resilient force to resist downward movement of the depressable key component from the extended position to the depressed position; and variable displacement-sensing circuitry. The method may further include responding to displacement of the depressable key component between the extended position and the depressed position by using the variable displacement-sensing circuitry to detect displacement of the depressable key component relative to the key switch housing, and to provide one or more variable displacement signals that vary in character based on the amount of displacement of the depressable key component between the extended position and the depressed position.

DESCRIPTION OF ILLUSTRATIVE EMBODIMENTS

Figure 1:
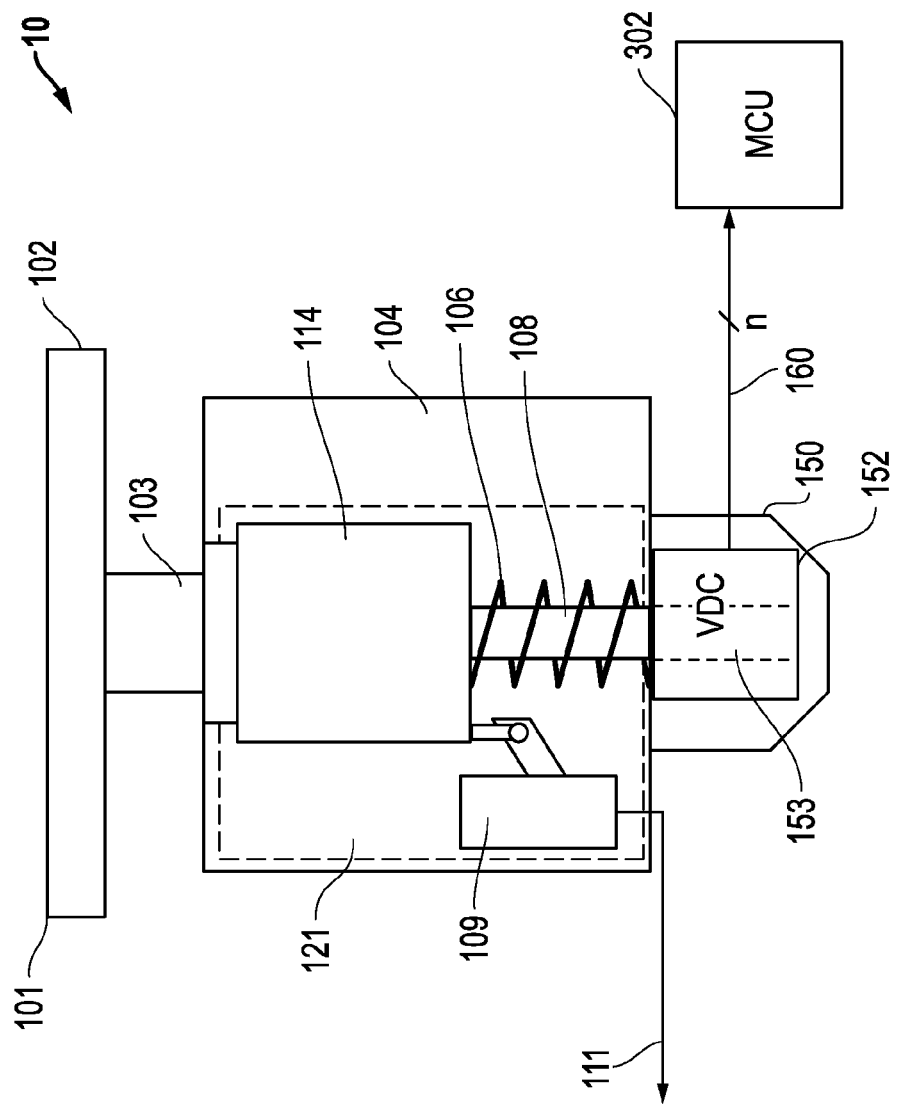
FIG. 1 illustrates a side cut-away view of a spring loaded mechanical key switch assembly according to one exemplary embodiment of the disclosed systems and methods.

FIG. 1 illustrates one exemplary embodiment of a spring loaded mechanical key switch assembly 10 configured to have variable displacement sensing capability. In this embodiment, key switch assembly 10 includes a depressable key component 101 movably received within a complementary dimensioned cavity 121 defined within key switch chassis housing 104. As shown, the depressable key component 101 may include a key cap 102 coupled to a shaft 103, plunger body 114, and plunger axle 108. In one embodiment, the depressable key component 101 may be depressable as single unit downward, e.g., as a single piece of plastic that is received within cavity 121 of a plastic key switch housing 104, although other materials or combinations of materials are possible for both depressable key switch component 101 and key switch housing 104, e.g., such as ceramic materials. Moreover, it is possible that depressable key component 101 may be made up of two or more assembled pieces.

Figure 4:
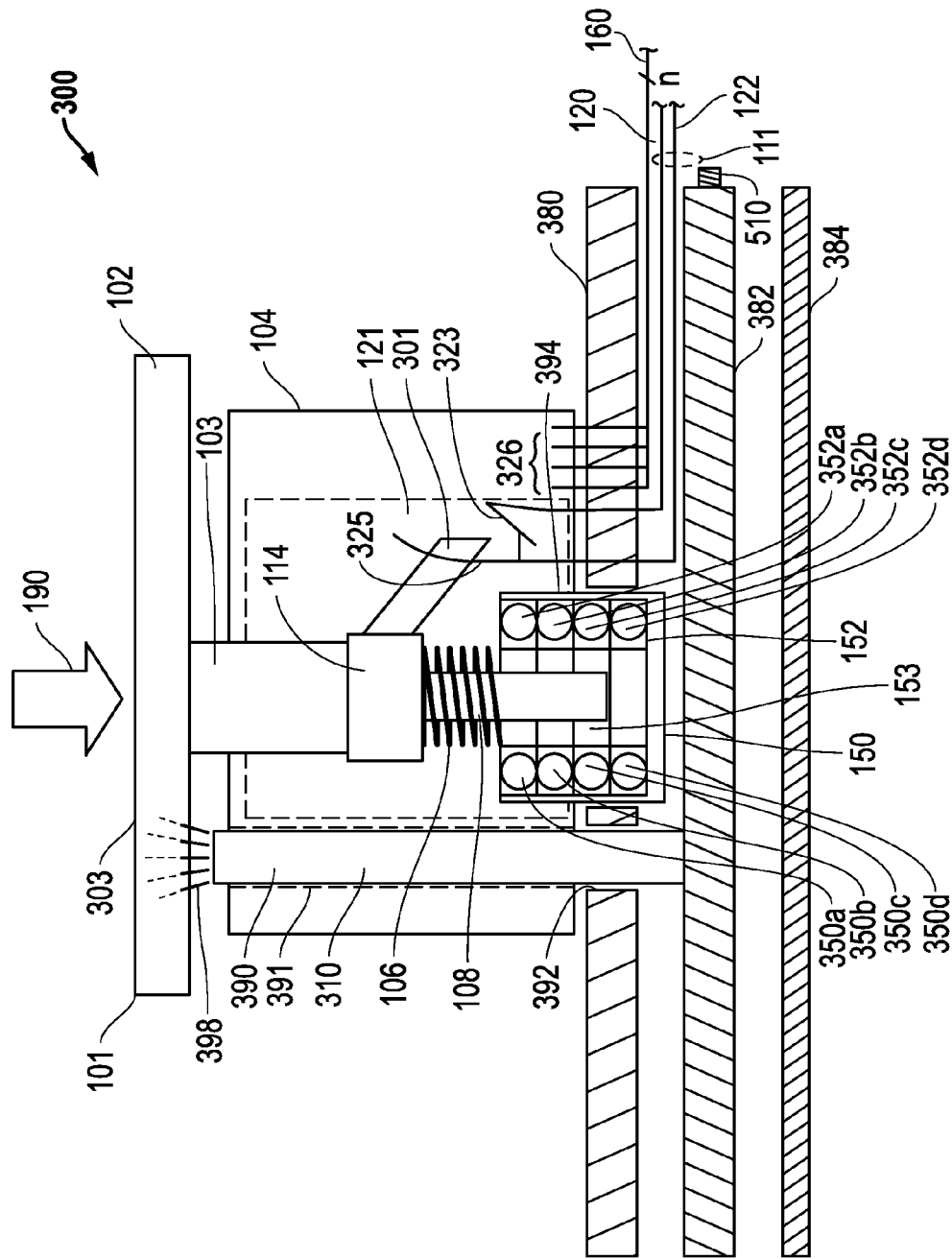
FIG. 4 illustrates a side cut-away view of a spring loaded mechanical key switch assembly according to one exemplary embodiment of the disclosed systems and methods.

Still referring to FIG. 1, key switch housing 104 of this embodiment includes a displacement-sensing key well 150 having a plunger cavity 153 defined therein into which plunger axle 108 is received when key cap 102 is depressed downward by a force 190 as shown in FIGS. 2 and 4, e.g., such as may be provided by a user's finger pressing the key cap 102. In this exemplary embodiment, an internal spring element in the form of a compression coil (or helical) spring 106 made of metal (e.g., such as stainless steel, spring steel, etc.) that is resting on the top of key well 150 (e.g., by virtue of the diameter of coil spring 106 being greater than the internal diameter of plunger cavity 153 and the external diameter of plunger axle 108) may be provided as shown wrapped around plunger axle 108 and configured to be compressed against the top of key well 150 when key cap 102 is depressed downward within key switch housing chassis 104. In this manner, compression of internal spring 106 provides a resilient force to resist the downward movement of depressable key component 101, and/or to urge depressable key component 101 upward, within key switch housing chassis 104 such that there is always tension on the user's finger, and to return the depressable key component 101 to its non-depressed extended position. It will be understood that a spring loaded mechanical key switch assembly may be provided with any alternative configuration of one or more spring elements of metal or other suitably elastic material that is suitable for providing a resilient force to resist the downward movement of a depressable key component, imparting tension to a user's finger during downward travel, and/or for urging a depressable key component 101 to return to its extended position, e.g., such as metal torsion springs, metal clock springs, etc. Moreover, it is also possible that more than one spring element may be present.

Also shown in FIG. 1 is optional digital signal circuitry 109 that is coupled to provide an on/off digital output signal 111 (e.g., to a legacy keyboard controller of an information handling system) when depressable key component 101 is depressed downward by a predetermined extent, e.g., such as when depressable key component 101 has been depressed downward by about 50% of the total possible downward travel length of depressable key component 101. Although the spring loaded mechanical key switch assembly 10 of FIG. 1 is illustrated having both digital signal circuitry 109 and a displacement-sensing key well 150 that includes variable displacement-sensing circuitry 152, it will be understood that in other embodiments a spring loaded mechanical key switch assembly may only be provided with a displacement-sensing key well 150 that includes variable displacement-sensing circuitry 152, and not provided with any digital signal circuitry 109 (e.g., mechanical make/break key contacts) such that the spring loaded mechanical key switch assembly is incapable of providing on/off digital output signals 111.

As further shown in FIG. 1, displacement-sensing key well 150 includes variable displacement-sensing circuitry 152 that is configured to detect and measure downward and/or upward key travel (and/or current position) of depressable key switch component 101 and to provide variable displacement signals 160 of varying character to displacement measurement circuitry 302 as shown. In this regard the character (e.g., voltage, current, signal state, etc.) of variable displacement signals 160 may vary according to the relative displacement of the depressable key component between the extended position and the depressed position of depressable key switch component 101 so as to indicate or to be indicative of the relative displacement of the depressable key component between the extended position and the depressed position. Variable displacement-sensing circuitry 152 may be implemented using any type, or combination of types, of sensor circuitry (e.g., one or more positional sensors) that is suitable for detecting changes in downward travel distance or depth of depressable key switch component 101 corresponding to downward displacement of a key cap 102. Example types of electrical sensor circuitry that may be employed include, but are not limited to, capacitive sensing circuitry, resistive sensing circuitry, optical sensing circuitry, electrical field (E-field) or magnetic field (H-field) change detection circuitry, etc. In this regard, variable displacement-sensing circuitry 152 may be configured to detect and measure downward and/or upward key travel of depressable key switch component 101 and provide variable displacement signals 160 throughout the entire downward and upward travel range of depressable key switch component 101 independent of the operation of digital signal circuitry 109 and conduction of on/off digital output signal 111.

However, variable displacement-sensing circuitry 152 may be alternatively configured to detect and measure downward and/or upward key travel of depressable key switch component 101 and provide variable displacement signals 160 only after depressable key component 101 has been depressed downward by a predetermined extent (e.g., about 50% of the total possible downward travel length) to cause digital signal circuitry 109 to provide an on/off digital output signal 111. In either embodiment, a user will be able to feel their finger continuing to travel beyond the 50% initial "make" digital signal point, and the variable displacement-sensing circuitry 152 will continue to report various plunger depth levels until 100% downward key travel has been achieved.

Figure 2A:
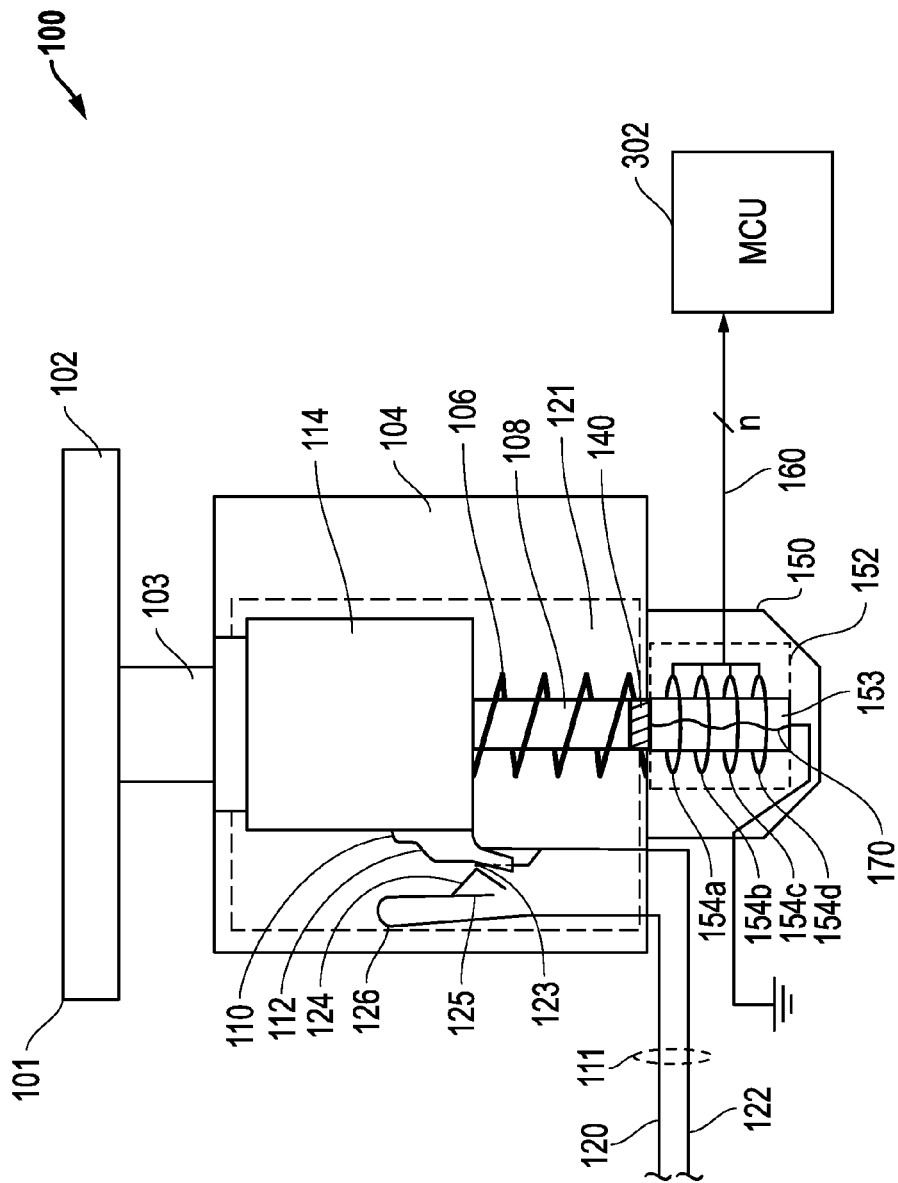
FIG. 2A illustrates a side cut-away view of a spring loaded mechanical key switch assembly according to one exemplary embodiment of the disclosed systems and methods.

FIG. 2A shows one exemplary embodiment of a spring loaded mechanical key switch assembly 100 having one exemplary embodiment of digital signal circuitry 109 in the form of mechanical make/break key contacts 125 and 123 that are coupled to respective separate key switch pins 120 and 122 to provide an on/off digital output signal 111 when depressable key component 101 is depressed to cause contacts 125 and 123 to make contact with each other as shown in FIG. 2, i.e., by bending contact 123 toward contact 125. In this regard, plunger body 114 also is provided as shown with a positioning ridge 110 that is configured and positioned to displace contact 123 toward contact 125 as depressable key component 101 moves downward within key switch chassis housing 104. Positioning ridge 110 may also be provided with a stepped and ramped surface 112 that is configured to mechanically interact or interfere with a bendable contact leg 126 that is biased against ramped surface 112 so as cause a "snap" or "click" action that is detectable by the user when depressable key component 101 is depressed downward by a predetermined extent as shown in FIG. 2A.

In one embodiment where depressable key component 101 has a total downward travel length of about 4 millimeters, make/break key contacts 125 and 123 may be configured such that the "make" (on or closed condition) connection for the switch assembly 100 is made at about the 2 millimeter downward travel position (i.e., greater than or equal to about 50% downward travel) of depressable key component 101, while the "break" (off or open condition) connection for the switch assembly 100 is maintained above the 2 millimeter downward travel position (i.e., less than about 50% downward travel) of depressable key component 101. However, it will be understood that downward travel lengths that are greater or less than about 4 millimeters may be employed as desired or needed for a given application, and/or that make/break points may be configured to occur at positions of depressable key component 101 that are greater than or less than 50% downward travel. For example, a total downward travel length of about 2 millimeters or 1.5 millimeters may be employed in one embodiment for spring loaded mechanical key switch assemblies that are installed in a notebook computer or other relatively thin form factor information handling system. In such a case, the "make" connection for the switch assembly may be made at about the 1 millimeter or 0.75 millimeter downward travel position, respectively.

Figure 2B:
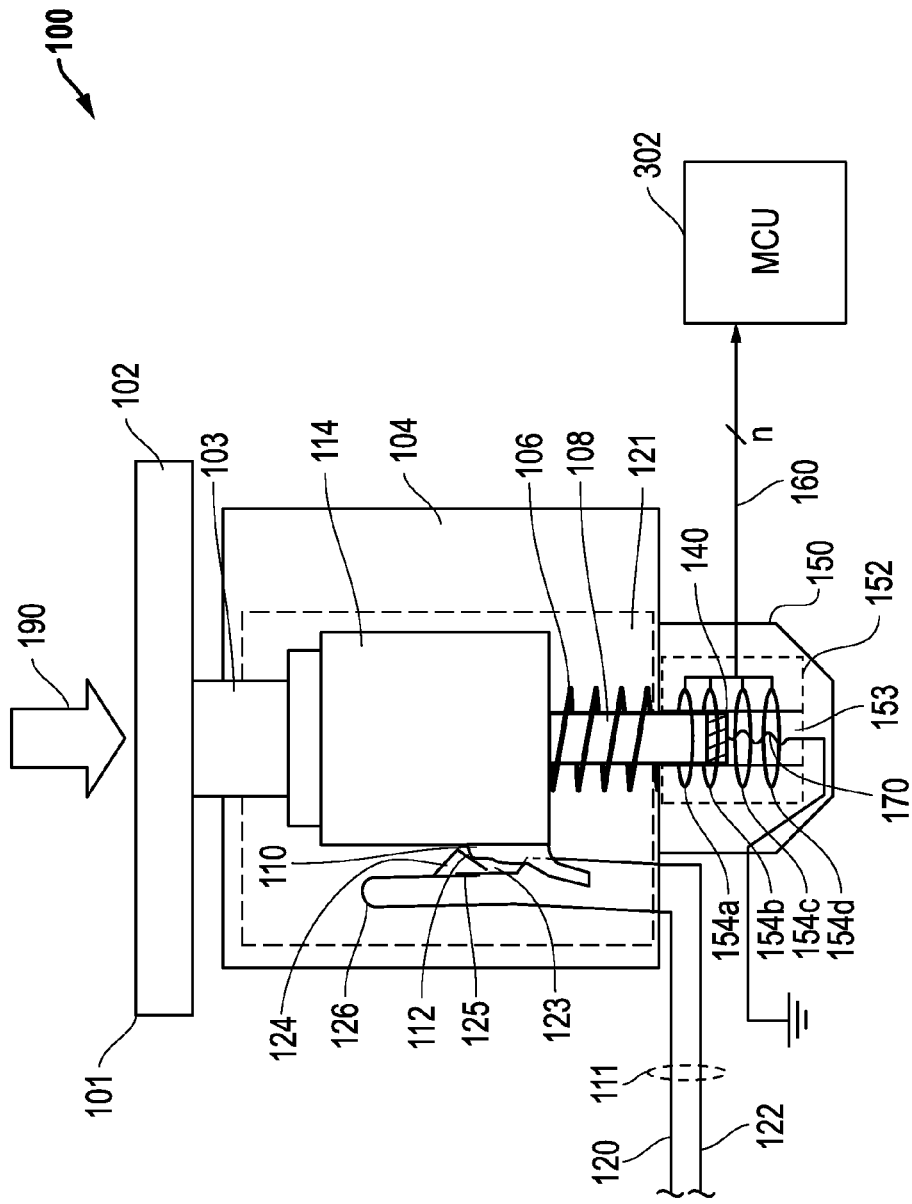
FIG. 2B illustrates a side cut-away view of a spring loaded mechanical key switch assembly according to one exemplary embodiment of the disclosed systems and methods.

As further shown in FIG. 2A, displacement-sensing key well 150 includes variable displacement-sensing circuitry 152 that in this exemplary embodiment employs capacitive sensing technology to determine the travel position of the plunger axle 108. In particular, variable displacement-sensing circuitry 152 of this embodiment includes a set of electrical sensors configured as a set of multiple stationary conductive (e.g., metal) elements in the form of aligned conductive sensor rings 154a to 154d, and a movable conductive (e.g., metal) element 140 (e.g., plate, ring, strip, etc.) that may be provided as shown disposed on a distal end of plunger axle 108 so that it travels with plunger axle 108 to extend through successive conductive sensor rings 154a to 154d in different positions as depressable key component 101 is depressed downward. In FIGS. 2A-2B, conductive sensor rings 154 are drawn in perspective view for purpose of illustration relative to plunger axle 108 which extends therethrough. Although illustrated as conductive rings in FIG. 2A, it will be understood that stationary conductive sensor ring 154 may be configured any other suitable geometry (bar-shaped solid, plate-shaped solid, rectangular or square ring shape, diamond ring shape, oval ring shape, etc.) for acting as a stationary capacitive plate to allow measurement of the positioning of movable conductive element 140 relative to each of stationary conductive sensor rings 154 in a manner as described elsewhere herein. The movable conductive element 140 may be made with a flat or non-flat surface relative to the conductive sensor rings 154. In one exemplary embodiment, the design and configuration of sensor rings 154 and movable conductive element 140 may be made to ensure that the distance between the stationary and movable elements is constant and with a constant dielectric gap width between the stationary and movable elements (in this case, air is the dielectric, although a dielectric is not limited to this and other dielectric materials may be employed).

In the illustrated embodiment, movable conductive element 140, otherwise known as "the target", functions as a movable capacitive plate which may either be coupled to ground or to any constant voltage, e.g., via wire conductor 170 or any other suitable method such as using an electrical conductor within metal plunger axle 108 that itself is electrically coupled to ground or any constant voltage. Each of stationary conductive elements 154a to 154d may function as individual stationary second capacitor plates that are each coupled to a respective analog signal trace 160 as an input to displacement measurement circuitry 302 which in this embodiment is provided in the form of a microcontroller (e.g., a Texas Instruments MSP430F55xx family of USB enabled 16-bit ultra-low power microcontrollers (MCU) (such as the MSP430F2111 or MSP430F5508), available from Texas Instruments of Dallas, Tex.) that runs firmware stored on a memory device associated with the microcontroller. In this embodiment, a voltage may be applied to the set of stationary conductive sensor rings 154, and changes in the electric field between each sensor ring 154 and the movable target 140 are measured as values or relative levels of induced voltage measured at each sensor ring 154. The peak voltage of all the sensor rings 154 is sensed by the displacement-sensing circuitry 152 and used to determine the travel position of the plunger axle 108, and thus the downward displacement of depressable key component 101. It will be understood however that any other type of digital and/or analog displacement measurement circuitry 302 may be employed that is suitable for measuring or otherwise recognizing or reacting to changes in state of variable displacement signals 160 of any variable displacement-sensing mechanical key switch assembly disclosed herein due to downward and upward travel of depressable key switch component 101 along the axis of plunger axle 108.

In one embodiment, displacement measurement circuitry 302 may employ RC capacitive measurement methodology with falling edge event driven interrupt performed on a per pin or signal trace basis. Further information on variable capacitive sensing and/or RC capacitive measurement may be found, for example, in U.S. patent application Ser. No. 12/316,703 filed Dec. 16, 2008; U.S. patent application Ser. No. 12/802,468 filed Jun. 8, 2010; in U.S. patent application Ser. No. 12/930,125 filed Dec. 29, 2010; and in U.S. patent application Ser. No. 13/232,707 filed Sep. 14, 2011, each of which is incorporated herein by reference in its entirety. It will also be understood that any other type of suitable capacitive-sensing circuitry may be employed including, for example, any circuitry that uses RC discharge time to measure sensor capacitance as described in U.S. Pat. No. 3,936,674, which is incorporated herein by reference in its entirety.

In one exemplary embodiment, displacement measurement circuitry 302 may be configured to monitor induced voltage on each of stationary conductive elements 154 in real time via respective signal traces 160, including at any time during keyboard operation that depressable key component 101 is depressed downward within key switch housing chassis 104. In this regard, measured induced voltage will be greatest for any given one of stationary conductive elements 154a to 154d when movable conductive element 140 is positioned opposite (at its closest point to) the given stationary conductive element 154. Moreover, the relative induced voltage of stationary conductive elements 154a to 154d may be compared or otherwise analyzed to determine (e.g., by interpolation of the measured voltage values) a position of movable conductive element 140 when it is located between any given two of stationary conductive elements 154a to 154d, as well as when it is positioned above conductive element 154a or below conductive element 154d. For example, in a case where measured induced voltage is near baseline voltage (non-depressed value) for conductive elements 154a and 154b, while at the same time measured induced voltage is at an elevated and substantially equal value for conductive elements 154c and 154d, an interpolation may be made by displacement measurement circuitry 302 to calculate the current position of movable conductive element 140 as being located in-between conductive elements 154c and 154d. This indicates that depressable key component 101 is almost entirely pressed downward to its furthest extent.

Thus, for example, in one exemplary embodiment, spring loaded mechanical key switch assembly 100 may be configured such that depressable key component 101 has a total downward travel length of about 4 millimeters within cavity 121, although greater or lesser travel lengths are alternatively possible. In such an embodiment, four individual stationary conductive elements 154 may be spaced center-to-center by about 0.5 millimeters apart, and such that the center of movable conductive element 140 is: directly opposite (or even with) the center of stationary conductive element 154a when depressable key component 101 has been displaced downward by about 2 millimeters, directly opposite (or even with) the center of stationary conductive element 154b when depressable key component 101 has been displaced downward by about 2.5 millimeters (as shown in FIG. 2B), directly opposite (or even with) the center of stationary conductive element 154c when depressable key component 101 has been displaced downward by about 3 millimeters, and directly opposite (or even with) the center of stationary conductive element 154d when depressable key component 101 has been displaced downward by the full 4 millimeters displacement. Although four stationary conductive elements 154 are illustrated in FIGS. 2A and 2B, it will be understood that any number of one or more stationary conductive elements 154 may alternatively be employed depending on the displacement measurement resolution that is desired or needed for a given application, including greater than or less than four stationary conductive elements 154. Moreover, the center-to-center spacing between adjacent stationary conductive elements 154 may be selected to define the desired granularity of key travel measurement to be detected for depressable key component 101.

Figure 3:
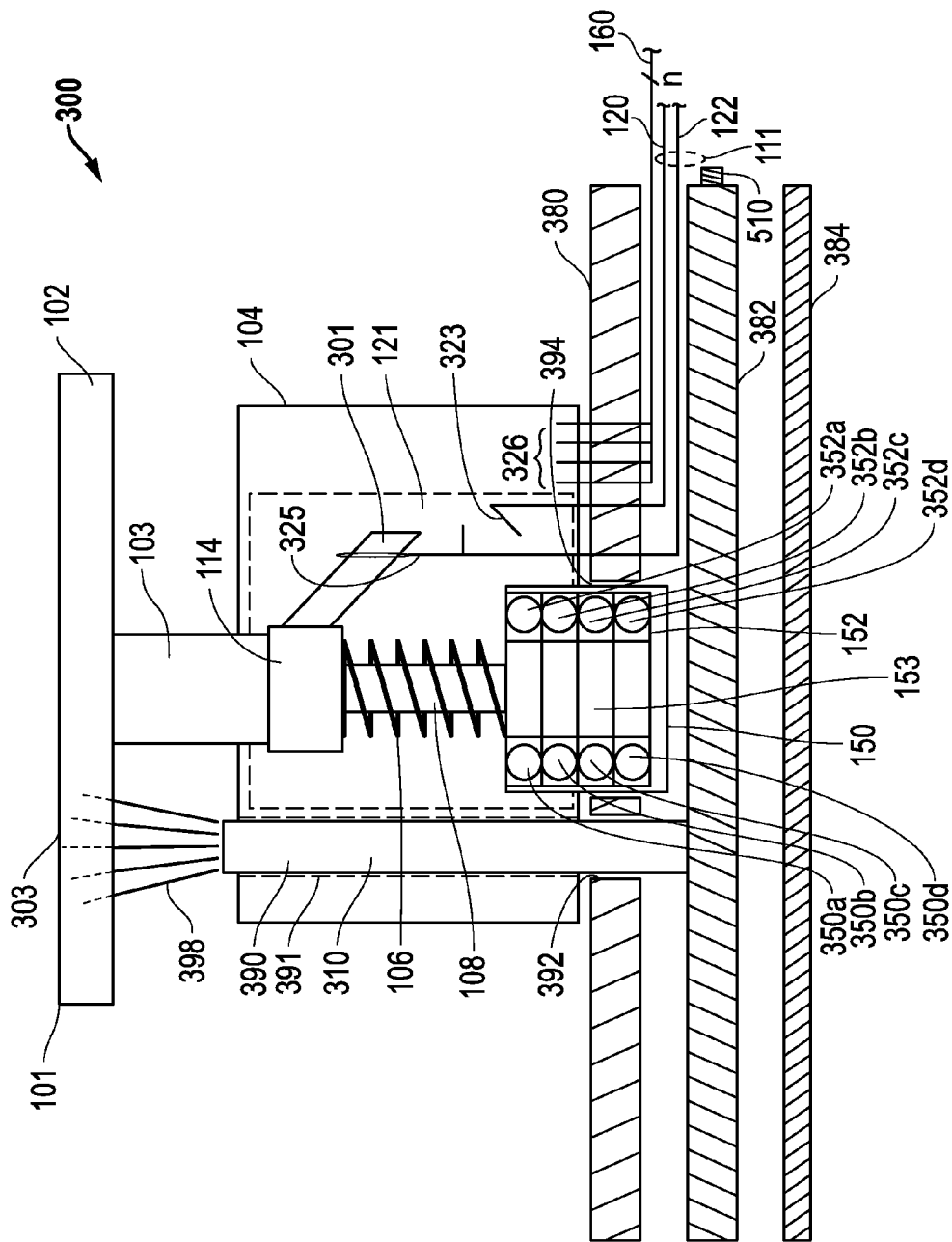
FIG. 3 illustrates a side cut-away view of a spring loaded mechanical key switch assembly according to one exemplary embodiment of the disclosed systems and methods.

It will be understood that the embodiment of FIGS. 2A and 2B is exemplary only, and that other mechanical and electrical contact configurations of spring loaded mechanical key switch assembly 100 and/or sensor configurations of displacement-sensing circuitry 152 may be employed in other embodiments. In this regard, displacement-sensing circuitry 152 may be any other suitable type, or combination of types, of sensor circuitry that is suitable for detecting changes in downward travel distance of plunger axle 108 corresponding to press depth of a key cap 102. For example, FIG. 3 illustrates another exemplary embodiment of a spring loaded mechanical key switch assembly 300 that is also configured to have variable displacement sensing capability using optical sensing circuitry. In this embodiment, key switch assembly 300 also includes a depressable key component 101 that is movably received within a complementary dimensioned cavity 121 defined within key switch chassis housing 104. The depressable key component 101 may include a key cap 102 coupled to a shaft 103, plunger body 114, and plunger axle 108 as shown.

Similar to the embodiment of FIGS. 2A and 2B, key switch housing 104 of the FIG. 3 embodiment includes a displacement-sensing key well 150 having a plunger cavity 153 defined therein into which plunger axle 108 is received when key cap 102 is depressed downward by a force 190 as shown in FIG. 4. An internal coil spring 106 (e.g., resting on the top of key well 150) may also be provided as before around plunger axle 108 and configured to be compressed when key cap 102 is depressed downward within key switch housing chassis 104. In FIG. 3, mechanical make/break key contacts 323 and 325 of one exemplary embodiment of digital signal circuitry 109 are coupled to respective separate key switch conductors 120 and 122 to provide an on/off digital output signal 111 when depressable key component 101 is depressed to cause contacts 325 and 323 to make contact with each other as shown in FIG. 4, i.e., in this embodiment by bending contact 323 toward contact 325. After contact is made, the 323 to 325 electrical make connection is continued thru the duration of the 2 mm-4 mm key travel (or other travel distance with which the key switch assembly has been configured). In this embodiment, plunger body 114 is provided with an extending finger 301 that is positioned and configured to displace contact 325 toward contact 323 as depressable key component 101 moves downward within key switch chassis housing 104. In this embodiment, no optional stepped and ramped surface is provided, so that no "snap" or "click" action is detectable by the user when depressable key component 101 is depressed downward in the manner as of the embodiment of FIGS. 2A and 2B. Thus, it will be understood that variable displacement sensing capability may be provided for a variety of configurations of spring loaded mechanical key switches, including different types of make/break contacts and/or different configurations of depressable key components and key switch housing chassis 104.

In the embodiment of FIGS. 3-4, a displacement-sensing key well 150 is employed that includes displacement-sensing circuitry 152 that in this exemplary embodiment includes multiple single channel optical sensor pairs configured as four multiple light sources (e.g., light emitting diodes "LEDs" or other suitable light emitting elements) 350a to 350d stacked on top of each other on one side of plunger cavity 153 and that are each mechanically and optically aligned with a corresponding one of four respective optical sensors (e.g., phototransistors) 352a to 352d on the other side of the plunger cavity 153. Optical sensors 352 may be, for example, photo microsensors, or other suitable optical sensor elements) that are stacked on top of each other on an opposing side of plunger cavity 153 as shown with each light source/optical sensor pair being positioned at a different key travel depth, it being understood that more than four or less than four optical sensor pairs may be alternatively employed depending on the displacement travel measurement resolution that is desired or needed for a given application. Moreover, a fewer number of light sources 350 may be provided than optical sensors 352, e.g., one light source 350 configured to illuminate four optical sensors 352.

One example of a suitable LED/phototransistor combination 350/352 known as a Dual Channel Transmissive optical sensor is available as part number TCUT1300X01 from Vishay, and provides one LED paired to two phototransistors. Such a multi-channel optical sensor may be employed in one embodiment to achieve space savings over use of multiple single channel sensors. Examples of other suitable optical sensors include phototransistor devices available from Omron Electronic Components, LLC. In yet another embodiment, a displacement-sensing key well 150 may be employed that includes displacement-sensing circuitry 152 that includes multiple transmissive type photointerrupters such as ROHM part number RPI-121 available from Rohm Co. Ltd. which are stacked on top of each other (4 total shown). The transmissive type photointerrupter has a LED light source 350 on one side of plunger cavity 153 and is mechanically and optically aligned with a corresponding one of four respective optical sensors (e.g., phototransistors) on the other side of the plunger cavity 153. Use of the transmissive type photointerrupter may be selected due to its ability to be minimally influenced from stray light. In yet another exemplary embodiment, a displacement-sensing key well 150 may be employed that includes displacement-sensing circuitry 152 that includes multiple reflective type photo sensors such as ROHM part number RPR-220 available from Rohm Co. Ltd.

As with the embodiment of FIGS. 2A-2B, depressable key component 101 may be configured in one exemplary embodiment to have a total downward travel length capability of about 4 millimeters within cavity 121, and optical sensor pairs may be spaced center-to-center by about 0.5 millimeters apart, although other values of key component travel length and/or center-to-center spacing may be employed in other embodiments. In this regard, the center-to-center spacing between adjacent stacked optical sensor pairs may be selected to define the desired granularity of key travel to be detected for a given depressable key component 101. In this embodiment, the number of displacement levels detected and reported by signals 160 corresponds to the number of optical sensor pairs provided within displacement measurement circuitry 302.

In operation of circuitry 152, each light source 350 is configured to emit a light beam across plunger cavity 153 to a corresponding one of light sensors 352. As shown in FIG. 3, when depressable key component 101 is in its non-depressed (fully-extended) state, plunger cavity 153 is open to allow a light beam from each of light sources 350 to be received by its corresponding optical sensor 352, indicating that depressable key component 101 is not depressed. However, as shown in FIG. 4, as key cap 102 is depressed downward by a force 190, the distal end of plunger axle 108 enters plunger cavity 153 between the successive pairs of aligned light sources 350 and optical sensors 352 in different positions as depressable key component 101 is depressed downward as shown.

In this alternative embodiment, displacement measurement circuitry 302 may be configured to monitor in real time analog signal traces 160 corresponding to each of the individual respective optical sensors 352a to 352d to detect when a light beam from a corresponding respective paired light source 350 is being received across cavity 153, and when it has been obscured by presence of plunger axle 108 within cavity 153. In this way, displacement measurement circuitry 302 may continually determine and re-determine how far plunger axle 108 and depressable key component 101 has been depressed or displaced downward at any given time based on the which optical sensors 352 are still receiving light from light source's 350. For example, in FIG. 4 the light sources 350 for all optical sensors 352 have been blocked by plunger axle 108 except for the lowermost pair of light source 350d/optical sensor 352d. This state is indicated by signal traces 160 and may be communicated to displacement measurement circuitry 302, indicating to displacement measurement circuitry 302 that depressable key component 101 has been depressed downward to a distance that corresponds to location of optical sensor 352c (since optical sensors 352a, 352b and 352c are blocked from receiving light from respective light sources 350a, 350b and 350c) but not to a distance that corresponds to optical sensor 352d (since light sensor 352d still receives light from light source 350d).

Figure 9:
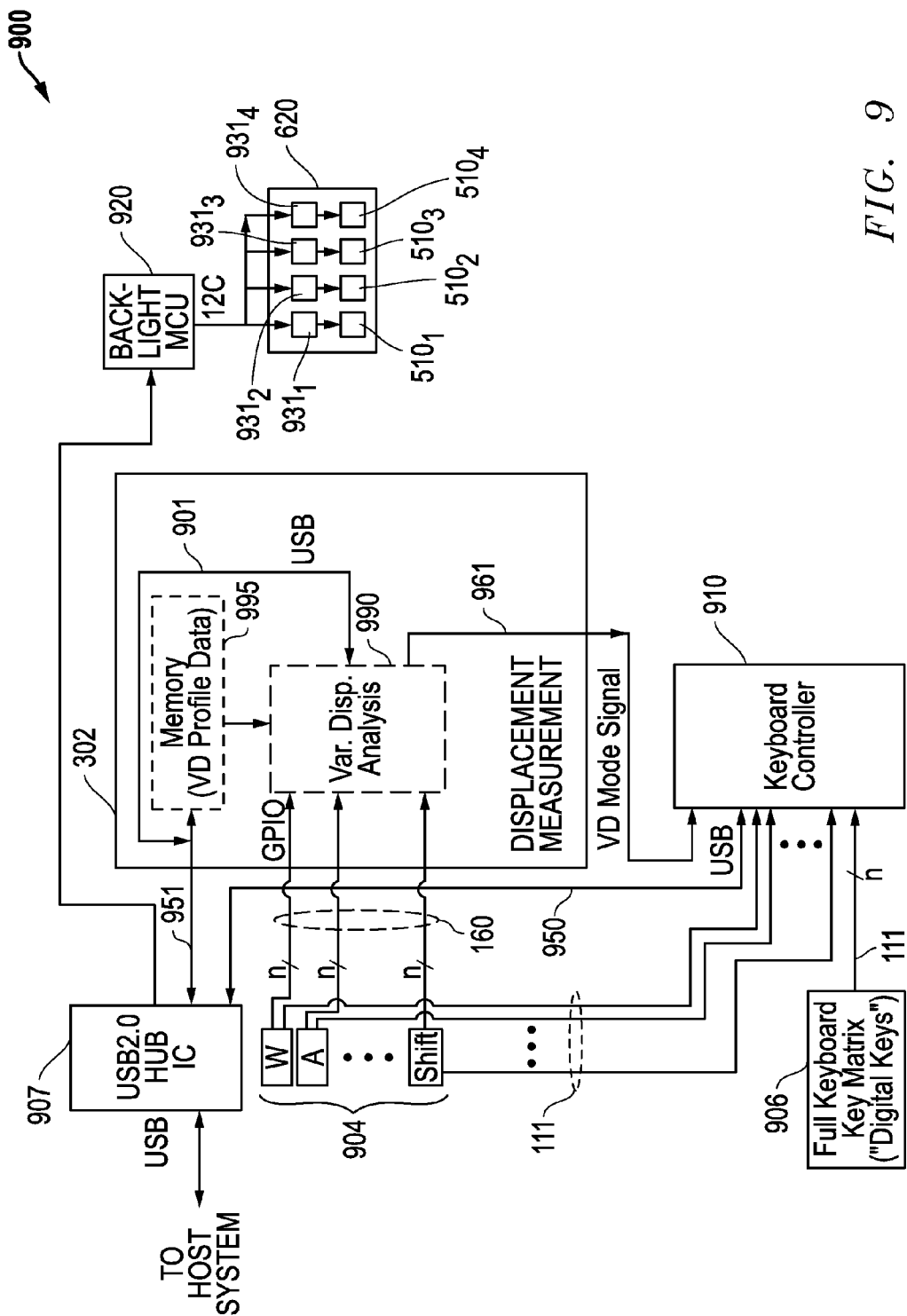
FIG. 9 illustrates a block diagram for a keyboard system according to one exemplary embodiment of the disclosed systems and methods.

Still referring to the embodiment of FIGS. 3-4, spring loaded mechanical key switch assembly 300 is shown mounted (e.g., by "pop-in" mechanical interference fit) within an optional opening or hole 394 defined in a component side of a printed circuit board (PCB) 380 that includes circuitry, such as separate key switch conductors 120 and 122 that are configured for coupling to provide an on/off digital output signal 111 (e.g., to circuitry such as a legacy keyboard controller 910 of FIG. 9), it being understood that a key switch assembly may be mounted to a PCB 380 or other suitable support structure in any suitable manner, e.g., including surface mounted to PCB 380. It will also be understood that the spring loaded mechanical switch assembly 100 of FIGS. 2A-2B may be similarly mounted to a PCB, e.g., for a computer keyboard assembly application. Any suitable type of displacement measurement circuitry may be coupled to receive a signal output 160 of each of phototransistors 352 via leads 326 extending from key switch chassis housing 104, e.g., via signal traces that may be provided on PCB 380 as shown and soldered to leads 326 to provide signals from LED/phototransistor pairs (e.g., such as to displacement measurement circuitry 302 of FIGS. 1-2 and 9). Power for light sources (LEDs) 350 may be provided by voltage signals found on the PCB 380 (e.g., a voltage trace on PCB 380, such as a filtered or switched version of a USB Vcc signal). In the particular embodiment of FIGS. 3-4, some of the sensors are found internal to the key switch housing (on the component side of the PCB), and some are found in the key switch housing but requiring a hole in the PCB to accommodate deeper key travel distance.

In one exemplary embodiment, FIGS. 3-4 may be implemented using displacement measurement circuitry 302 that is similar as the embodiment of FIGS. 1-2. For example, displacement measurement circuitry 302 may be provided in the form of a controller, e.g., a 16-bit ultra-low power capacitive sensing microcontroller part number MSP430F2111 available from Texas Instruments of Dallas Tex. However, in this optical sensor embodiment, displacement measurement circuitry 302 may be configured to measure the voltage from each phototransistor output 160, and determine the amount of key displacement.

Figure 5:
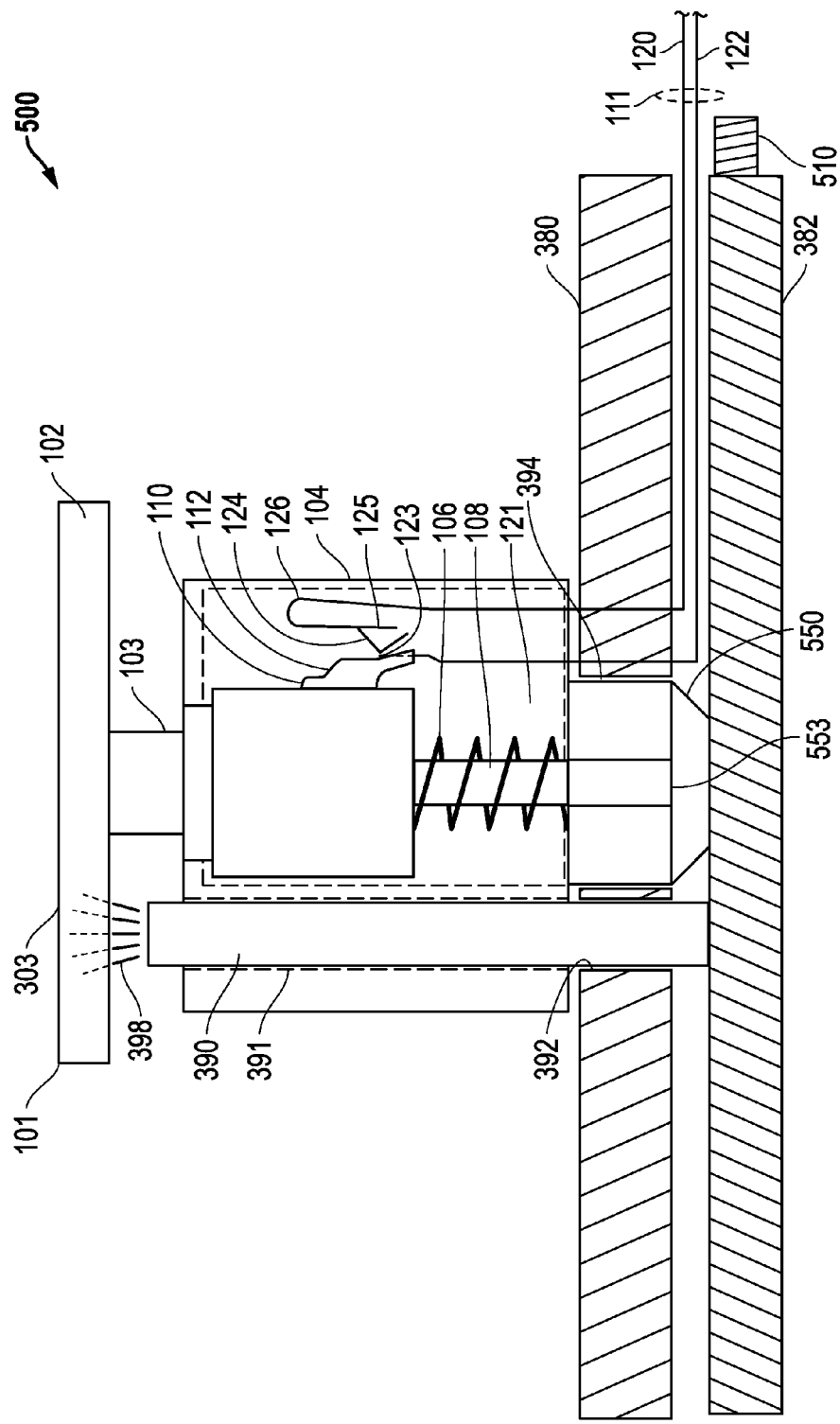
FIG. 5 illustrates a side cut-away view of a spring loaded mechanical key switch assembly according to one exemplary embodiment of the disclosed systems and methods.
Figure 7:
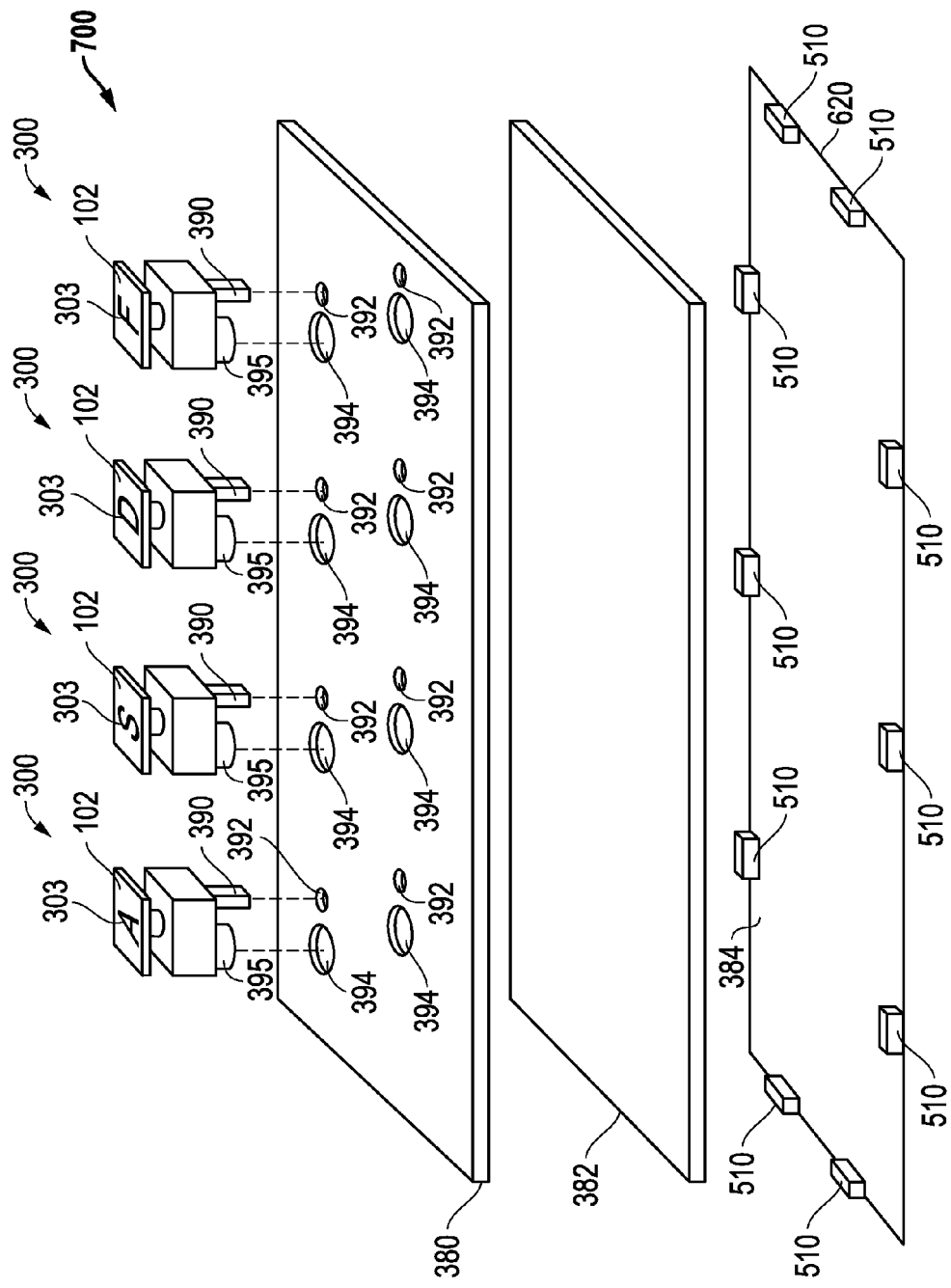
FIG. 7 illustrates an exploded perspective view of a keyboard assembly according to one exemplary embodiment of the disclosed systems and methods.

FIGS. 3-4 also illustrate how optional key cap lighting may be provided for spring loaded mechanical key switch assembly 300, it being understood that similar key lighting components may be provided for other embodiments and different configurations of spring loaded mechanical key switch assemblies, such as those illustrated in FIGS. 1-2 and FIG. 5. In this embodiment, key cap 102 (e.g., such as a plastic key cap) may have one or more light-transmissive key feature/s 302 (e.g., such as a laser etched alphanumeric character, laser etched key cap rim, defined aperture, transparent or translucent key surface, and/or other light transmissive feature) that extends through the keycap 102 from beneath the key cap 102 through the top surface of the key cap 102 such that light 398 emitted from beneath the key cap 102 by a light pipe 390 is visible by a user from above the key cap 102 through the light transmissive key feature/s 302. One example of a top view of such light-transmissive key features 302 is illustrated in the embodiment of FIG. 7. Further information on laser etched indicia and key rims may be found in U.S. Pat. No. 8,411,029, which is incorporated herein by reference in its entirety.

As shown in FIGS. 3-4, light pipe 390 passes through an opening 391 defined in the key switch chassis housing 104 to one side of the mechanical switch components (shaft 103, plunger body 114, plunger axle 108, spring 106 and key well 150) from a planar light spreader component 382 (e.g., acrylic sheet, polycarbonate sheet such as Lexan®, or other suitable light-transmitting material) through an opening 392 defined in PCB 380 to a position beneath the key cap 102. Light pipe 390 may be any suitable light conductive structure that is configured to pipe light from light spreader 382 through PCB 380 and switch chassis housing 104 to the underside of key cap 102. In one embodiment, light spreader 382 may be a substantially light-transparent material that may be optionally laser-etched to control diffusion of light received from light sources 510, e.g., so as to control light spreading in order to contain emitted light from selected light sources 510 within specified regions of light spreader 382 such as further described in relation to FIG. 8.

As further shown in FIGS. 3-4, an optional light reflective film 384 (e.g., flexible white colored plastic film) may be provided beneath light spreader component 382 as shown for purposes of reflecting and spreading light from light sources 510 more evenly across light spreader 382. In FIGS. 3-4, the space shown between PCB 380 and light spreader 382, and the space shown between light spreader 382 and reflective film 384 may be configured as suitable to allow for operative cooperation between these components, and in one exemplary embodiment these may be planar components that are closely butted up against each other with substantially no space between the components with the exception that tolerance of spacing between PCB 380 and light spreader 382 may be configured to accommodate the depth of key well 150. Any needed or desired spacing between PCB 380 and light spreader 382 may be provided by a separate spacer layer/s provided between PCB 380 and light spreader 382, and length (and therefore depth) of light pipe 390 may be adjusted accordingly to maintain suitable operative relationship with light spreader 382.

Light pipe 390 of FIGS. 3-4 may be constructed of any suitable light transmissive material (e.g., such as acrylic, polycarbonate, etc.) and may be configured as an elongated cylindrical shape as shown, although other shapes are possible such as elongated square shape, elongated oval shape, elongated rectangular shape, etc. Light pipe 390 may be of any dimension (length, cross-sectional area, etc.) that is suitable for transmitting sufficient light from light spreader 382 that is positioned below the key assembly 300 to illuminate a desired portion or portions of key cap 102 in un-pressed or fully depressed position of the key cap 102. The upper light-emitting end of light pipe 390 underneath key cap 102 may be flush with a top surface of key switch chassis housing 104, or may alternatively be recessed below key switch chassis housing 104 or extend above key switch chassis housing 104. The upper light-emitting end of light pipe 390 underneath key cap 102 may also be optionally textured, angled, or otherwise configured in a manner that diffuses emitted light 398 or directs the emitted light 398 in one or more desired directions, e.g., such as directed toward the center of the key cap 102 and away from the outer edge of the key cap 102. Moreover, it will also be understood that more than one light pipe 390 may be provided to illuminate a key cap 102 of a given single spring loaded mechanical key switch assembly 300.

Still referring to FIGS. 3-4, a lower first end of light pipe 390 may be positioned to butt up against or otherwise contact or lie adjacent to light spreader component 382 in a manner that allows light to be transferred from light spreader 382 to light pipe 390. A relatively small diffuser area (e.g., a laser etched "dot") may be provided on spreader 382 at each point where a given light pipe 390 contacts or lies adjacent light spreader 382 to facilitate transmission of light from light spreader 382 to the given light pipe 390. Light spreader 382 may in turn be edge-lit from right-angle oriented LEDs (e.g., RGB LEDs or single color LEDs) 510 as shown, it being understood that light sources 510 may be alternatively oriented relative to spreader 382 at angles other than 90 degrees and/or in any other position relative to edges or sides of light spreader 382 that is suitable for emitting light that is transferred into light spreader 382. The light transferred from light spreader 382 to light pipe 390 is then transmitted through light pipe 390 so as to shine upwards to the underside of key cap 102 in a manner such that the light illuminates the light transmissive key feature 302 in a manner that is visible by a user.

In the practice of the disclosed systems and methods, light pipe 390 may be assembled to other components in any suitable manner. For example, in one exemplary embodiment, light pipe 390 may be pre-assembled as an integral part of a spring loaded mechanical key switch assembly 300 that is then assembled to PCB 380 through aperture 392 at the same time the remainder of spring loaded mechanical key switch assembly 300 (e.g., key well 150 and electrical pins 323, 325 and 326) are assembled to PCB 380. In another exemplary embodiment, light pipe 390 may be provided as an integral part of light spreader 382 (e.g., glued to or inserted with a friction fit into an complementary-dimensioned opening defined in the upper surface of spreader 382) to which the spring loaded mechanical key switch assembly 300 and PCB 380 are then assembled by sliding aperture 392 of the key switch housing chassis 104 over light pipe 390 when assembling key assembly 300 to PCB 380.

FIG. 5 illustrates another exemplary embodiment of a lighted spring loaded mechanical key switch assembly 500 having a key cap 102 with light transmissive key feature 302 but that does not have having variable displacement sensing capability. In this regard, spring loaded mechanical key switch assembly 500 is provided with plunger cavity 553 defined within a key well 550 that includes no displacement sensing circuitry but that otherwise has digital make/break mechanical key contact circuitry similar to the embodiment of FIGS. 2A-2B. As shown, spring loaded mechanical key switch assembly 500 includes a light pipe 390 that is similarly configured to illuminate light transmissive key features 302 from light provided by light spreader 382 in the manner of the embodiment of FIGS. 3 and 4. Although not illustrated, lighted spring loaded mechanical key switch assembly 500 may also be provided with any suitable digital signal circuitry 109 such as described elsewhere herein. In yet another embodiment, a lighted spring loaded mechanical key switch assembly having a plunger cavity 153 defined within a displacement-sensing key well 150 that includes variable displacement-sensing circuitry 152, but that has no digital make/break mechanical key contact circuitry or other type of digital signal circuitry 109, may be provided with a light conductive structure such as a light pipe 390, e.g., to illuminate light transmissive key features 302 of a keycap 102 of a key switch assembly that is incapable of providing on/off digital output signals 111.

Figure 6:
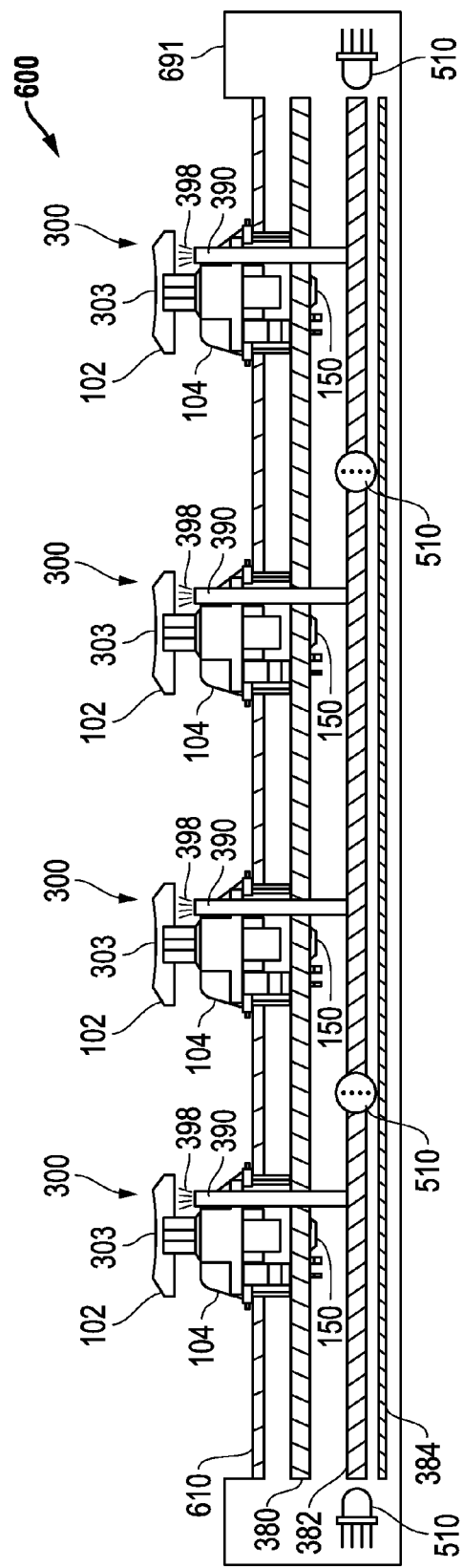
FIG. 6 illustrates a side cut-away view of a spring loaded mechanical key switch assembly according to one exemplary embodiment of the disclosed systems and methods.

FIG. 6 illustrates a side view of a keyboard assembly 600 that includes multiple spring loaded mechanical key switch assemblies 300 that are assembled to PCB 380, light spreader 382, and reflective film 384 in a manner as previously described. As shown, multiple edge mounted right angle light sources 510 are arrayed around at least two edges of light spreader 382 to provide light for illuminating spreader 382, light pipes 390 and key caps 102 of keyboard assembly 600. Further shown is an optional face plate 610 (e.g., planar sheet of metal and/or plastic) that may be provided to shield the light spreader from user view, provide ruggedness and mechanical support to the key housing 104 and to protect the internal components of the keyboard assembly 600. Each of face plate 610, PCB 380, light spreader 382, and reflective film 384 may be operatively supported in relation to each other from edge mounting points (e.g., brackets, grooves, shelves, etc.) provided on the interior sides or other surfaces of a chassis 691 that surrounds or otherwise houses the components of keyboard assembly 600.

FIG. 7 illustrates an exploded perspective view of a keyboard assembly 700, showing positioning of four spring loaded mechanical key switch assemblies 300 with plastic mounting guides 395 that are each positioned for assembly into key assembly openings 394 defined in PCB 380. Also shown are light pipes 390 corresponding to each key switch assembly 300 that are positioned for insertion into four corresponding light pipe openings 392 defined in PCB 380. Light spreader 382 is shown positioned between PCB 380 and a combination flex circuit assembly 620 that includes reflective film 384 integrated together with right angle mounted light sources 510 onto a flex circuit component (e.g., polyimide, polyether (ether) ketone, transparent conductive polyester, etc.). In this regard, light sources 510 may be adhered or otherwise mounted to the flex circuit sheet before assembly to light spreader 382 and PCB 380 as part of a keyboard assembly that is contained within or otherwise mounted as part of a keyboard chassis, e.g., with an optional face plate 610 overlying PCB 380 as shown in FIG. 6. In one exemplary embodiment, a flex circuit may be adhered to the underside of a thin white reflective plastic-like film 384, and the flex circuit may be configured to route, for example, the LED power and return signals, current limiting resistors, and right angle surface mount RGB LEDs. A cutout may be provided in the reflective film 384 to allow each right angle LED to pop up thru the top side of the reflective film 384 so that the LED can light up the cross-sectional area (or side) of the light spreader 382.

Also shown in FIG. 7 are four additional pairs of key assembly openings 394 and light pipe openings 392 defined in PCB 380 for receiving additional spring loaded mechanical key switch assemblies 300 and light pipes 390. In this regard, it will be understood that a keyboard assembly may be configured with any pattern and number of pairs of key assembly openings 394 and light pipe openings 392 as needed or desired to fit a given back-lighted keyboard application. For example, in one exemplary embodiment, 104 pairs of key assembly openings 394 and light pipe openings 392 may be defined in PCB 380 in a pattern suitable for mounting and backlighting 104 spring loaded mechanical key switch assemblies 300 of a QWERTY keyboard, although other patterns and numbers of pairs of key assembly openings 394 and light pipe openings 392 may be provided in other embodiments to support other types and sizes of keyboard assemblies.

Figure 8:
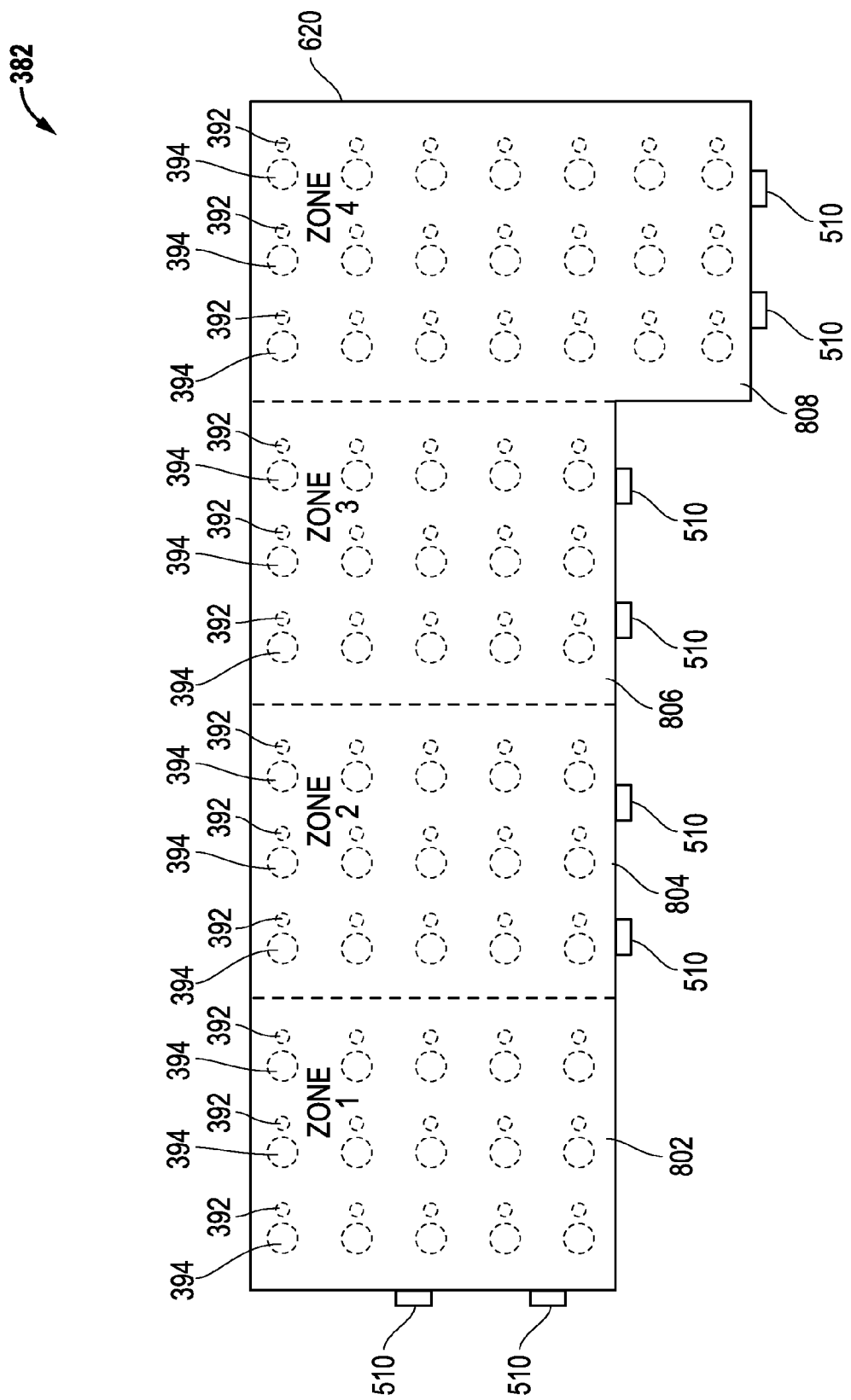
FIG. 8 illustrates an overhead view of a light spreader component according to one exemplary embodiment of the disclosed systems and methods.

FIG. 8 illustrates a top view of one exemplary embodiment of a single sheet light spreader component 382 assembled to right angle mounted light sources 510 in an operative relationship to provide multiple separate backlighting zones (zones 1, 2, 3 and 4 labeled as 802, 804, 806 and 808) for a keyboard assembly. In such an embodiment, eight light sources 510 may be mounted onto a combination flex circuit assembly 620 that underlies light spreader 382 and is not visible in FIG. 8. In one embodiment, such a light spreader configuration may be provided for a full size computer keyboard assembly, such as a 104-key QWERTY keyboard assembly. In such an embodiment, each backlighting zone may be dimensioned and configured to underlie and separately light a portion of the total number of keys. Distance between the LEDs 510 of adjacent zones, and/or the angle at which each LED 510 emits light into the light spreader 382 may be selected to minimize light bleeding between adjacent zones. Although FIG. 8 illustrates a single sheet light spreader component 382, it will be understood that a light spreader component 382 having multiple sheets or multiple light-transmissive segments is also possible. Further, it will be understood that in other embodiments not all key switch assemblies need be back-lighted, nor do all segments of a keyboard assembly need to underlain by a light-transmissive light spreader component.

As an example, positions for multiple key assembly openings 394 and corresponding light pipe openings of an overlying PCB 380 are illustrated in dashed outline to show how each backlighting zone 802, 804, 806 and 808 of a light spreader 382 may separately illuminate a different group of spring loaded mechanical key switch assemblies 300. Specifically, FIG. 8 illustrates a configuration capable of backlighting 15 mechanical key switch assemblies 300 in each of zones 1, 2 and 3; and 21 mechanical key switch assemblies in zone 4, using two light sources in each zone. This translates into a ratio of backlit keys to light sources that is equal to 66 keys/8 light sources or 8.25 backlit keys per light source. Thus, using the disclosed systems and methods, key caps 102 of multiple spring loaded mechanical key switches may be backlit by one or more common light sources 510 to achieve a ratio of backlit keys to light sources that is greater than 1. This is as opposed to conventional spring loaded mechanical key switches that each employ a separate LED for key lighting, i.e., using a ratio of backlit keys to light sources that is equal to 1.

Advantageously, the disclosed systems and methods thus may be implemented in one embodiment using fewer light sources powered only by USB bus power (without an AC adapter) to backlight substantially all the keys of a large keyboard assembly (e.g., including keyboard assemblies having 80 or more keys such as a 104-key QWERTY keyboard) than would be required by a conventional spring loaded mechanical key switch keyboard assembly of similar size and having one light source per key (which would require use of an AC adapter). For example, a typical RGB LED light source draws 60 milliamps (20 mA for red, 20 mA for green, and 20 mA blue). Thus a conventional mechanical key switch keyboard assembly with 104 keys that each has its own RGB LED key light would draw a total 31 watts to power the 104 LEDs alone, and would therefore require an AC/DC adapter to power the lighted keyboard assembly. In contrast, a 104-key mechanical key switch keyboard assembly employing 12 edge mounted RGB LEDs as light sources 510 to illuminate a light spreader 382 and light pipes 390 provided for each key in a manner as disclosed herein would only draw a total of 3.5 watts, and could therefore be powered by two USB 2.0 ports from an attached information handling system, which have a maximum capacity of 5 watts. This avoids the need for powering the disclosed keyboard assembly from an AC/DC adapter.

In an embodiment such as illustrated in FIG. 8, light sources $510_1$ may be separately controlled to provide different lighting characteristics (e.g., different light intensity, different light color, different light flashing pattern, etc.) and/or lighting animation/graphics at any given time to the light pipes and key caps overlying zone 1 than light sources $510_2$, $510_3$ and $510_4$ display to the light pipes and key caps overlying zones 2, 3, and/or 4. Each of zoned light sources $510_2$, $510_3$ and $510_4$ may also be separately controlled relative to light sources $510_1$ and to each other. In this way, light sources 510 of the different zones 802, 804, 806 and 808 may be individually controlled to display a light pattern that moves across the keyboard area (e.g., such as a sequential change of color or flashing pattern in the form of a "wave" moving from one zone to another across the keyboard), to display different colors simultaneously in different zones, to display a pattern of flashing light in one zone while all other zones are non-flashing, etc.

FIG. 9 illustrates a block diagram for a keyboard system 900 including both variable displacement-sensing spring loaded mechanical key switch assemblies 904 and digital output-only spring loaded mechanical key switch assemblies 906 (e.g., that do not have displacement-sensing circuitry 152). Examples of conventional spring loaded mechanical key switch assemblies 906 include, but are not limited to, Cherry MX Key Switches available from ZF Electronic Systems of Pleasant Prairie, Wis.; and Kailh Switches available from Kaihua Electronics Co., Ltd from Tangxia Town, Dongguan City, Guangdong Province, China. Each of variable displacement-sensing mechanical key switch assemblies 904 may be, for example, a spring loaded mechanical key switch assembly 10, 100, or 300 such as described herein in relation to FIGS. 1, 2A-2B, 3 and 4. Each of mechanical key switch assemblies 906 may be, for example, a conventional spring loaded mechanical key switch assembly or a key switch assembly that is similar to one of spring loaded mechanical key switch assemblies 10, 100, or 300 but without the displacement-sensing circuitry 152 and variable displacement output signals 160. Key switch assemblies 904 and 906 may together be provided in any suitable number or configuration, e.g., so as together implement a total of 104 mechanical key switch assemblies to implement a QWERTY keyboard configuration, with just a portion of the total keys (e.g., corresponding to W, A, S and D keys) being variable displacement-sensing spring loaded mechanical key switch assemblies 904. It will be understood, however, that all key switch assemblies of a keyboard may alternatively be configured as variable displacement-sensing spring loaded mechanical key switch assemblies 904.

Also illustrated in FIG. 9 are optional backlighting circuitry components, that include one or more backlight controller/s 920, e.g., such as an ST Micro 8051F347 microcontroller available from ST Microelectronics of Geneva, Switzerland. In such an embodiment, event driven backlighting may be implemented by communicating events from an application programming interface (API) executing on a host information handling system across communication interface 907 to the backlight controller 920, which responds by communicating lighting commands (e.g., via I²C bus) to light source current driver circuitry component/s 931 which each drive one or more light sources (e.g. LEDs) 510 accordingly to control on, off and/or color operation of the light sources. In one exemplary embodiment, each of light source current driver circuitry component/s 510 may be a MAX7313 serial interfaced peripheral available from Maxim Integrated of San Jose, Calif., each of which is capable of driving up to five RGB LEDs 510 of a given backlighting zone 802, 804, 806 or 808 of light spreader 382 of FIG. 8, e.g., to light individual spring-loaded mechanical key switch assemblies 300 or 500 equipped with light pipes 310 previously described.

As depicted in FIG. 9, for this embodiment a keyboard controller 910 is coupled to receive an on/off digital output signal 111 (e.g., via a legacy key matrix) from digital signal circuitry 109 of each key switch assembly 904 and 906 that is detected by controller 910 as representing a digital key switch assembly that is either pressed or not pressed. Keyboard controller 910 may be implemented, for example, as a microcontroller (e.g., legacy 8051-based microcontroller or custom microcontroller) that runs firmware stored on a memory device associated with the keyboard controller 910. Control circuitry within the keyboard controller 910 processes these digital key signals 111 and is connected to an output communication path so that this processed digital key information 950 can be communicated to external devices that are external to the keyboard system 900, such as host components of an information handling system (e.g., such as desktop computer or notebook computer) that includes a host processor such as a CPU, e.g., through a universal serial bus (USB) interface 907 or other suitable interface. In one exemplary embodiment, all components of keyboard system 900 may contained within a chassis 691 of a keyboard assembly 600 such as illustrated in FIG. 6, although this is optional. In such a case, external devices such as host processing devices, may be coupled to receive signals from the components of keyboard system 900 that are contained within a chassis 691.

In addition, external devices can optionally communicate control and/or other configuration information to the keyboard controller through this same output communication interface 950. Further information on legacy keyboard controller operation may be found in U.S. patent application Ser. No. 12/802,468 filed Jun. 8, 2010; in U.S. patent application Ser. No. 12/930,125 filed Dec. 29, 2010; and in U.S. patent application Ser. No. 13/232,707 filed Sep. 14, 2011, each of which is incorporated herein by reference in its entirety. Examples of possible information handling system components may be found described in U.S. patent application Ser. No. 12/586,676, filed Sep. 25, 2009, now U.S. Pat. No. 8,307,222; and in U.S. patent application Ser. No. 13/232,707 filed Sep. 14, 2011, each of which is incorporated herein by reference in its entirety.

Still referring to FIG. 9, displacement-sensing circuitry 152 of each key switch assembly 904 provides variable displacement signals 160 to displacement measurement circuitry 302 as shown. For example, in the exemplary embodiment of FIGS. 3-4, multiple phototransistor outputs 160 may be routed to GPIO input lines of a microcontroller configured to operate as displacement measurement circuitry 302. Variable displacement signals 160 may be analog signals indicating the amount of downward displacement that has been applied to depressable key components 101 of one or more key switch assemblies 904, as previously described. When a given spring loaded mechanical switch assembly 904 is depressed, one or more corresponding analog signal/s 160 indicating or indicative of the amount of downward displacement that has been applied to depressable key components 101 of the given key switch assembly 904 may be provided to variable displacement analysis block 990 displacement measurement circuitry 302 as shown. It will be understood that in one embodiment the variable displacement signals 160 may alternatively be multiplexed with each other to reduce the number of separate signal paths 160 required, e.g., using a crossbar switch or other suitable signal multiplexing technology. In another exemplary embodiment, multiple variable displacement keys 904 may be pressed simultaneously, and multiple corresponding analog signal outputs 160 received from each key 904 may be processed by the displacement measurement circuitry 302 for each of the multiple displacement outputs 951 reported (one per respective key 904).

Following is an exemplary description of the operation for a dual make/break and displacement sensing operation of a spring loaded mechanical key switch assembly 300 such as illustrated in FIGS. 3-4, assuming for sake of illustration only that the spring loaded mechanical key switch assembly 300 is configured to support a total of 4 millimeter of downward travel for depressable key component 101 from fully extended position and has four optical sensor pairs 350/352. In this example, the operation of spring loaded mechanical key switch assembly 300 proceeds as follows in response to a downward pressure 190 applied by the finger of a user.

First, as the user presses the keycap 102 and depressable key component 101 downward by about 2 millimeters (i.e., about 50% of full travel distance), the electrical "make" connection is made by virtue of contact between make and break key contacts 325 and 323 and is reported to the keyboard controller 910 (e.g., a conventional legacy Keyboard MCU). In parallel and at the same time, the first (uppermost) optical sensor pair 350a/352a detects that depressable key component 101 has traveled downward to its depth and sends a corresponding signal 160a to the displacement measurement circuitry 302 to indicate this has key displacement event occurred. As shown in FIGS. 3-4, other sensor pairs 350/352 are stacked on top of one another, e.g., to detect each additional 0.5 mm travel of key press depth from one another. Thus, as a user continues to press keycap 102 and depressable key component 101 further downward to about 2.5 millimeters, the second optical sensor pair 350b/352b detects this occurrence and sends a corresponding signal 160b to the displacement measurement circuitry 302 to indicate this key displacement event has occurred. Similarly as a user continues to press keycap 102 and depressable key component 101 further downward to about 3 millimeters the third optical sensor pair 350c/352c detects this occurrence and sends a corresponding signal 160c to the displacement measurement circuitry 302 to indicate this key displacement event has occurred. Finally, as a user continues to press keycap 102 and depressable key component 101 further downward to about 3.5 millimeters the fourth optical sensor pair 350d/352d detects this occurrence and sends a corresponding signal 160d to the displacement measurement circuitry 302 to indicate this key displacement event has occurred.

Displacement measurement circuitry 302 may be provided in one exemplary embodiment as an integrated part of a keyboard device body, e.g., contained within a chassis of the keyboard together with other components of a keyboard assembly such as illustrated in FIGS. 6 and 7. However, one or more components and/or processing tasks of displacement measurement circuitry 302 may alternatively be integrated or otherwise implemented within a microcontroller that is operating as the keyboard controller 910 and/or as part of the host information handling system to which the keyboard is connected, if desired. One or more of the components of displacement measurement circuitry 302 could also be implemented with external circuitry, as well. Thus, it will be understood that the components and/or processing tasks of displacement measurement circuitry 302 may be implemented by any alternative configuration of one or more processing devices (e.g., controller, microcontroller, processor, microprocessor, ASIC, FPGA, CPU, etc.) of an information handling system or a peripheral component thereof, and alone or together with other types of information handling system processing tasks.

In the embodiment of FIG. 9, displacement measurement circuitry 302 includes a variable displacement analysis block 990 (that receives variable displacement signals 160) and memory that include variable displacement profile data 995 (e.g., as user configurable control parameters per level or extent of sensed key displacement on a per game or per application basis). In this embodiment, the variable displacement profile data may be loaded and/or modified in memory 995 from an external device across communication path 951, e.g., from an attached host using an application programming interface (API). The variable displacement profile data may be loaded from memory 995 into the Variable Displacement Analysis block (VDA) 990. The profile data 995 may be used by VDA block 990 as parameters for making decisions in the VDA block 990, e.g., such as understanding how much key switch displacement is required before triggering a particular scan code, and/or for specifying behavior resulting from any particular pressed variable displacement-sensing spring loaded mechanical key switch assembly 904. The scan code is output from the VDA 990 via the communication path 951 to the communication interface 907 to an external device (e.g., such as to a Host PC system via a USB bus interface).

In one exemplary embodiment, a user may assign a multi-character sequence (or macro) to the variable displacement profile data 995 for at least one given variable displacement-sensing key switch assembly 904 that corresponds to one or more particular sensed displacement levels for the given key assembly 904. When it is sensed that the given key assembly 904 is pressed and a given displacement level is sensed, a unique scan code 901 corresponding to the sensed displacement level may be output from displacement measurement circuitry 302 and sent via path 951 to an appropriate device driver (e.g., USB Human Interface Device "HID" driver) executing on a CPU of a host system. The USB HID device driver may then generate and send a HID keyboard report in the form of a variable displacement keyboard event to a variable displacement macro selector component of a middleware layer executing on the CPU of the host system. The variable displacement macro selector component intercepts this keyboard event information and may in turn provide a modified variable displacement scan code to a user application layer that provides the multi-character sequence desired for the sensed displacement level of the given key switch assembly 904. For example, keyboard profile data 995 may be customized on a per game basis, and the appropriate profile data 995 loaded into the VDA 990 once the corresponding game is loaded and running on the connected host information handling system.

In one exemplary embodiment, this capability may be supported by assigning individual macros to an unassigned scan code 901 that is one of multiple scan codes 901 supported by each variable displacement-sensing key switch assembly 904 of a keyboard assembly or other input/output device. In this way, scan codes may be dynamically selected in real time depending on the amount of pressure translating into measured key displacement that is applied to a given key switch 904 based on the user defined profile data 995 for that given key switch 904, in a manner as described for variable pressure sensing in U.S. patent application Ser. No. 12/930,125 filed Dec. 29, 2010; and in U.S. patent application Ser. No. 13/232,707 filed Sep. 14, 2011, each of which is incorporated herein by reference in its entirety. In this regard, variable displacement-based scan codes 901 may be generated and processed in the same manner as described for VPS scan codes in U.S. patent application Ser. No. 13/232,707, in which case the same type of USB HID driver may receive the variable displacement-based scan codes as receives the VPS pressure-based scan codes in U.S. patent application Ser. No. 13/232, 707. Moreover, the variable displacement keyboard events may be generated by the USB HID driver in the same manner as VPS keyboard events are generated in U.S. patent application Ser. No. 13/232,707, and the USB HID driver may provide these variable displacement keyboard events to a variable displacement macro selector of a middleware layer that operates in the same manner as VPS macro selector component of U.S. patent application Ser. No. 13/232,707, and which in turn may select the modified variable displacement-based scan codes (e.g., macro information in the form of a multi-key sequence) from a variable displacement profile based on the identity of the pressed key and the sensed displacement level of the pressed key in the same manner as VPS macro selector component of U.S. patent application Ser. No. 13/232,707 performs these tasks based on identity of a pressed key and the key's pressure level sensed.

Thus, a single spring loaded mechanical switch key assembly may be employed to support performing, for example, 5 macros (acting as 5 virtual keys), to support switching between macro outputs in real-time based on a variable input such as sensed key displacement, and/or to support different (e.g., user programmable and/or selectable) correlations of key output behaviors to sensed key displacement. It will be understood that use of scan codes and other variable pressure sensing features described in U.S. patent application Ser. No. 12/930,125 filed Dec. 29, 2010 and in U.S. patent application Ser. No. 13/232,707 with regard to pressure-sensing digital output circuitry and variable-pressure keys may be similarly implemented using displacement measurement circuitry 302, e.g., using sensed key displacement as a proxy for sensed key pressure.

It will be understood that the particular embodiments illustrated herein are exemplary only, and that the components and function of displacement measurement circuitry 302 may be implemented using any one or more circuitry components suitable for receiving analog signals 160 representative of key displacement from variable displacement-sensing circuitry 152 of key switch assemblies 904, and for selecting and providing in real time scan code/s corresponding to the key displacement applied to each of key switch assemblies 904. In addition, external devices may optionally communicate control and/or other configuration information to the displacement measurement circuitry 302 and/or keyboard controller 910 through communication interface 907. Although a USB interface 907 is illustrated in FIG. 9, it will be understood that communication paths 950 and/or 951 may alternatively communicate with other devices in other wired or wireless ways, for example, via a Bluetooth interface if a wireless interface is desired.

Also illustrated in FIG. 9 is optional mode signal 961 that may be provided from variable displacement analysis block 990 of displacement measurement circuitry 302 to keyboard controller 910 to indicate to keyboard controller 910 whether or not to output processed digital key information on output communication path 950 corresponding to on/off digital output signals 111 from variable displacement-sensing key switch assemblies 904. For example, during a designated variable displacement operation mode, one or more of key assemblies 904 may be designated for sole operation as variable displacement keys (e.g., such as W, A, S and D keys). In such a variable displacement-only operation mode, keyboard controller only outputs displacement-based scan codes 901 based on signals 160 from key switch assemblies 904, but does not output digital key information 950 corresponding to on/off digital output signals 111 received from key switch assemblies 904.

However, in some cases, the attached host information handling systems may enter a standby or a security state (e.g., due to a specified elapsed time of inactivity) that requires entry of a password using digital on/off key signals 111 entered from one or more of the designated "variable displacement only" key switch assemblies 904. In other cases, a user may desire to use one or more of the designated "variable displacement only" key switch assemblies 904 as momentary on digital keys to provide digital on/off key signals 111, e.g., for data or password entry. Accordingly, displacement measurement circuitry 302 may be controlled (e.g., by a control signal received from a host processor on occurrence of host standby condition, and/or by user keyboard entry code) to provide mode signal 961 to cause keyboard controller 910 to output processed digital key information 950 corresponding to on/off digital output signals 111 received from key switch assemblies 904 for as long as necessary or desired, e.g., for a particular operation purpose. In this way, mode signal 961 may be used to toggle key operation for variable displacement-sensing key switch assemblies 904 between "variable displacement-only" analog output operation and digital output operation.

It will be understood that in further embodiments, displacement measurement circuitry 302 may alternatively or additionally be implemented to process analog variable displacement signals 160 received from variable displacement-sensing key switch assemblies 904 in the same manner that pressure-sensing digital output circuitry processes analog output signals from variable pressure sensing analog keys as described in U.S. patent application Ser. No. 13/232,707 filed Sep. 14, 2011, which is incorporated herein by reference in its entirety. Further, keyboard controller 910 may alternatively or additionally be implemented to process on/off digital output signals 111 from digital signal circuitry 109 of each key switch assembly 904 and 906 in the same manner that legacy keyboard controller 110 processes digital output signals received via a key matrix from digital keys as described in U.S. patent application Ser. No. 13/232,707 filed Sep. 14, 2011, which is incorporated herein by reference in its entirety. In this way, variable displacement-sensing capability may be advantageously utilized to implement variable pressure features, and operation of displacement measurement circuitry 302 may interact with operation of keyboard controller 910 in the same way that pressure-sensing digital output circuitry interacts with the legacy keyboard controller of U.S. patent application Ser. No. 13/232,707.

Further, it will also be understood that legacy keyboard support and/or haptics capability may be provided to a keyboard assembly that employs variable displacement sensing spring loaded mechanical key switch assemblies 904 by utilizing features similar to those described in U.S. patent application Ser. No. 12/930,125 filed Dec. 29, 2010, which is incorporated herein by reference in its entirety. In this regard, displacement measurement circuitry 302 may be configured to output to switching circuitry a high and low (high/low) digital output bit stream signal having a frequency that is representative of the degree or percent of downward displacement being currently applied to a depressable key component 101 of one or more of variable pressure sensing mechanical key switch assemblies 904, and the switching circuitry may then provide a toggled key pressure indication signal in the form of alternating open/short (off/on) digital signal to a legacy keyboard controller in a manner that emulates toggling of a conventional momentary off/on digital key. Additionally or displacement measurement circuitry 302 may be configured to output to provided haptics control circuitry a digital signal (e.g., high/low digital signal) representative of the degree or percent of downward displacement being currently applied to a depressable key component 101 of one or more variable pressure sensing mechanical key switch assemblies 904, which in turn provides a haptics control signal to cause provided haptics actuation circuitry of variable displacement sensing spring loaded mechanical key switch assemblies 904 to produce a variable haptics motion characteristic corresponding to the pressure level applied to the given pressure sensitive key (e.g., as a vibration waveform having a particular vibration intensity and/or frequency that corresponds to the currently applied real time key pressure level). Examples of such haptics actuation circuitry include a piezo transducer that may be provided within or under a keycap 102 as separate circuitry from the haptics actuation circuitry of any other keycaps 102 of a keyboard assembly as described in U.S. patent application Ser. No. 12/930,118 filed Dec. 29, 2010, which is incorporated herein by reference in its entirety.

It will be understood that one or more of the tasks, functions, or methodologies described herein may be implemented, for example, as firmware or other computer program of instructions embodied in a non-transitory tangible computer readable medium that is executed by a CPU, controller, microcontroller, processor, microprocessor, FPGA, ASIC, or other suitable processing device.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A keyboard system, comprising:
one or more spring loaded mechanical key switch assemblies, each of the key switch assemblies comprising:
a key switch housing having a first end and a second end,
a downwardly depressable key component movably received within the key switch housing and having a first end and a second end, the first end of the depressable key component being linearly movable downward between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry configured to detect downward linear displacement of the depressable key component relative to the key switch housing and to provide one or more variable displacement signals that vary in character based on the amount of linear displacement of the depressable key component between the extended position and the depressed position; and
displacement measurement circuitry coupled to receive the variable displacement signals and to determine in real time the relative linear displacement of the depressable key component between the extended position and the depressed position based on the character of the provided variable displacement signals.

2. The system of claim 1, where the one or more variable displacement signals provided by the variable displacement-sensing circuitry are analog signals that comprises at least one of capacitive sensing circuitry, resistive sensing circuitry, optical sensing circuitry, electrical field (E-field) change detection circuitry, magnetic field (H-field) change detection circuitry, or a combination thereof.

3. The system of claim 1, where the displacement measurement circuitry is configured to determine and output a respective displacement-based scan code to one or more external devices corresponding to the particular determined real-time downward linear key displacement level for each of the key switch assemblies.

4. The system of claim 1, further comprising digital signal circuitry configured to provide an on/off digital output signal when the depressable key component is depressed downward by a predetermined extent.

5. The system of claim 1, where the drepressable key component is linearly movable downward and upward along a single axis.

6. The system of claim 1, where the second end of the depressable key component is closer to the second end of the key switch housing when the depressable key component is in the extended position than when the depressable key component is in the second position.

7. A keyboard system, comprising:
one or more spring loaded mechanical key switch assemblies, each of the key switch assemblies comprising:
a key switch housing having a first end and a second end,
a depressable key component movably received within the key switch housing and having a first end and a second end, the first end of the depressable key component being movable between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry configured to detect displacement of the depressable key component relative to the key switch housing and to provide one or more variable displacement signals that vary in character based on the amount of displacement of the depressable key component between the extended position and the depressed position; and displacement measurement circuitry coupled to receive the variable displacement signals and to determine in real time the relative displacement of the depressable key component between the extended position and the depressed position based on the character of the provided variable displacement signals;

where the depressable key component further comprises a plunger axle provided on the second end of the depressable key component, the plunger axle being closer to the second end of the key switch housing when the depressable key component is in the extended position than when the depressable key component is in the second position; where the key switch housing further comprises a key well provided on the second end of the key switch housing, a plunger cavity being defined in the key well, the plunger cavity being configured to receive the plunger axle therein when the depressable key component is depressed; and where the variable displacement-sensing circuitry is provided adjacent the second end of the key switch housing, the variable displacement-sensing circuitry being configured to detect displacement of the depressable key component relative to the key switch housing by sensing a position of the plunger axle within the key well.

8. The system of claim 7, where the variable displacement-sensing circuitry comprises multiple stationary electrically conductive elements disposed within the key well so as to be adjacent or within the plunger cavity, each of the stationary electrically conductive elements being coupled to provide a respective variable displacement signal as an induced voltage signal to the displacement measurement circuitry; and a movable electrically conductive element configured to travel with the plunger axle relative to the stationary electrically conductive elements as the depressable key component moves between the extended position and the depressed position; where the displacement measurement circuitry is configured to monitor the induced voltage between each of the stationary electrically conductive elements and the movable electrically conductive element to determine in real time the relative displacement of the depressable key component between the extended position and the depressed position.

9. The system of claim 7, where the variable displacement-sensing circuitry comprises multiple optical sensors and one or more light sources disposed within the key well, each given one of the multiple optical sensors being configured to receive light transmitted across the plunger cavity from at least one of the light sources when the plunger axle is not positioned in the plunger cavity between the given optical sensor and at least one of the light sources; and where the plunger axle is configured to block light transmitted across the plunger cavity from the at least one light source when the plunger axle is positioned between the given optical sensor and the at least one light source; where each of the optical sensors is coupled to provide a respective variable displacement signal as a light detection signal to the displacement measurement circuitry that indicates in real time whether or not light is currently being received across the plunger cavity from one of the light sources.

10. A keyboard system, comprising:
one or more spring loaded mechanical key switch assemblies, each of the key switch assemblies comprising:
a key switch housing having a first end and a second end,
a depressable key component movably received within the key switch housing and having a first end and a second end, the first end of the depressable key component being movable between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry configured to detect displacement of the depressable key component relative to the key switch housing and to provide one or more variable displacement signals that vary in character based on the amount of displacement of the depressable key component between the extended position and the depressed position; and
displacement measurement circuitry coupled to receive the variable displacement signals and to determine in real time the relative displacement of the depressable key component between the extended position and the depressed position based on the character of the provided variable displacement signals;
digital signal circuitry configured to provide an on/off digital output signal when the depressable key component is depressed downward by a predetermined extent; and
a keyboard controller coupled to receive the on/off digital output signal from the digital signal circuitry, the keyboard controller being configured to process the on/off digital output signal and to provide processed digital key information based on the on/off digital output signal to an external device.

11. The system of claim 10, where the displacement measurement circuitry is coupled to provide a variable displacement mode signal to the keyboard controller that instructs the keyboard controller whether or not to provide the processed digital key information based on the on/off digital output signal to an external device; and where the keyboard controller is configured to respond to the variable displacement mode signal by providing the processed digital key information based on the on/off digital output signal to an external device when instructed to do so by the variable displacement mode signal, and by not providing the processed digital key information based on the on/off digital output signal to an external device when instructed not to do so by the variable displacement mode signal.

12. An information handling system including the keyboard system of claim 10, comprising:
at least one host processing device configured to execute a user application thereon; and
a keyboard system according to claim 10;
where the keyboard controller is configured to process the on/off digital output signal and to provide the processed digital key information based on the on/off digital output signal to the at least one user application executing on the host processing device; and
where the displacement measurement circuitry is configured to determine and output a respective processed displacement-based output signal to the host processing device.

13. A spring loaded mechanical key switch assembly, comprising:
a key switch housing having a first end and a second end;
a downwardly depressable key component movably received within the key switch housing and having a first end and a second end, the first end of the depressable key component being linearly movable downward between an extended position and a depressed position relative to the first end of the key switch housing with the first end of the depressable key component being closer to the first end of the key switch housing in the depressed position than in the extended position;

a spring element configured to provide a resilient force to resist downward movement of the depressable key component from the extended position to the depressed position; and variable displacement-sensing circuitry configured to detect downward linear displacement of the depressable key component relative to the key switch housing and to provide one or more variable displacement signals that vary in character based on the amount of linear displacement of the depressable key component between the extended position and the depressed position.

14. The key switch assembly of claim 13, where the one or more variable displacement signals provided by the variable displacement-sensing circuitry are analog signals that comprise at least one of capacitive sensing circuitry, resistive sensing circuitry, optical sensing circuitry, electrical field (E-field) change detection circuitry, magnetic field (H-field) change detection circuitry, or a combination thereof.

15. The key switch assembly of claim 13, where the variable displacement-sensing circuitry comprises optical sensing circuitry.

16. The key switch assembly of claim 13, further comprising digital signal circuitry configured to provide an on/off digital output signal when the depressable key component is depressed downward by a predetermined extent.

17. The key switch assembly of claim 13, where the drepressable key component is linearly movable downward and upward along a single axis.

18. The key switch assembly of claim 13, where the second end of the depressable key component is closer to the second end of the key switch housing when the depressable key component is in the extended position than when the depressable key component is in the second position.

19. The method of claim 13, where the drepressable key component is linearly movable downward and upward along a single axis; and where the method further comprises responding to downward linear displacement of the depressable key component along a single axis between the extended position and the depressed position by using the variable displacement-sensing circuitry to detect downward linear displacement of the depressable key component along the single axis relative to the key switch housing, and to provide one or more variable displacement signals that vary in character based on the amount of downward linear displacement of the depressable key component along the single axis between the extended position and the depressed position.

20. The key switch assembly of claim 13, where the second end of the depressable key component is closer to the second end of the key switch housing when the depressable key component is in the extended position than when the depressable key component is in the second position.

21. A spring loaded mechanical key switch assembly, comprising:

a key switch housing having a first end and a second end;

a depressable key component movably received within the key switch housing and having a first end and a second end, the first end of the depressable key component being movable between an extended position and a depressed position relative to the first end of the key switch housing with the first end of the depressable key component being closer to the first end of the key switch housing in the depressed position than in the extended position;

a spring element configured to provide a resilient force to resist downward movement of the depressable key component from the extended position to the depressed position; and variable displacement-sensing circuitry configured to detect displacement of the depressable key component relative to the key switch housing and to provide one or more variable displacement signals that vary in character based on the amount of displacement of the depressable key component between the extended position and the depressed position;

where the depressable key component further comprises a plunger axle provided on the second end of the depressable key component, the plunger axle being closer to the second end of the key switch housing when the depressable key component is in the extended position than when the depressable key component is in the second position; where the key switch housing further comprises a key well provided on the second end of the key switch housing, a plunger cavity being defined in the key well, the plunger cavity being configured to receive the plunger axle therein when the depressable key component is depressed; and where the variable displacement-sensing circuitry is provided adjacent the second end of the key switch housing, the variable displacement-sensing circuitry being configured to detect displacement of the depressable key component relative to the key switch housing by sensing a position of the plunger axle within the key well.

22. The key switch assembly of claim 21, where the variable displacement-sensing circuitry comprises multiple stationary electrically conductive elements disposed within the key well so as to be adjacent or within the plunger cavity, each of the stationary electrically conductive elements being configured to provide a respective variable displacement signal as an induced voltage signal; and a movable electrically conductive element configured to travel with the plunger axle relative to the stationary electrically conductive elements as the depressable key component moves between the extended position and the depressed position; where the respective variable displacement signal provided by each given stationary electrically conductive element at any given time is indicative of the position of the movable electrically conductive element relative to the given stationary electrically conductive element at that given time.

23. The key switch assembly of claim 21, where the variable displacement-sensing circuitry comprises multiple optical sensors and one or more light sources disposed within the key well, each given one of the multiple optical sensors being configured to receive light transmitted across the plunger cavity from at least one of the light sources when the plunger axle is not positioned in the plunger cavity between the given optical sensor and at least one of the light sources; where the plunger axle is configured to block light transmitted across the plunger cavity from the at least one light source when the plunger axle is positioned between the given optical sensor and the at least one light source; where each given one of the optical sensors is coupled to provide a respective variable displacement signal as a respective light detection signal that indicates in real time whether or not light is currently being received across the plunger cavity from one of the light sources.

24. The key switch assembly of claim 21, where the spring element of the key switch assembly comprises a coil spring having a central opening that is disposed around the plunger axle, the coil spring being configured to provide a resilient force to resist downward movement of the depressable key component from the extended position to the depressed position and to return the depressable key component to its non-depressed extended position in the absence of a downward force applied to the depressable key component.

25. A method of operating one or more key switch assemblies, comprising:
providing one or more spring loaded mechanical key switch assemblies, each of the key switch assemblies comprising:
a key switch housing having a first end and a second end,
a downwardly depressable key component movably received within the key switch housing and having a first end and a second end, the first end of the depressable key component being linearly movable downward between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry; and
responding to downward linear displacement of the depressable key component between the extended position and the depressed position by using the variable displacement-sensing circuitry to detect downward linear displacement of the depressable key component relative to the key switch housing, and to provide one or more variable displacement signals that vary in character based on the amount of downward linear displacement of the depressable key component between the extended position and the depressed position.

26. The method of claim 25, where each of the key switch assemblies further comprises digital signal circuitry, and where the method further comprises using the digital signal circuitry to configured to provide an on/off digital output signal when the depressable key component is depressed downward by a predetermined extent.

27. A method of operating one or more key switch assemblies, comprising:
providing one or more spring loaded mechanical key switch assemblies, each of the key switch assemblies comprising:
a key switch housing having a first end and a second end,
a depressable key component movably received within the key switch housing and having a first end and a second end, the first end of the depressable key component being movable between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry; and
responding to displacement of the depressable key component between the extended position and the depressed position by using the variable displacement-sensing circuitry to detect displacement of the depressable key component relative to the key switch housing, and to provide one or more variable displacement signals that vary in character based on the amount of displacement of the depressable key component between the extended position and the depressed position;
where the depressable key component further comprises a plunger axle provided on the second end of the depressable key component, the plunger axle being closer to the second end of the key switch housing when the depressable key component is in the extended position than when the depressable key component is in the second position; where the key switch housing further comprises a key well provided on the second end of the key switch housing, a plunger cavity being defined in the key well, the plunger cavity being configured to receive the plunger axle therein when the depressable key component is depressed; where the variable displacement-sensing circuitry is provided adjacent the second end of the key switch housing; and where the method further comprises using the variable displacement-sensing circuitry to detect displacement of the depressable key component relative to the key switch housing by sensing a position of the plunger axle within the key well.

28. A method of operating one or more key switch assemblies, comprising:
providing one or more spring loaded mechanical key switch assemblies, each of the key switch assemblies comprising:
a key switch housing having a first end and a second end,
a depressable key component movably received within the key switch housing and having a first end and a second end, the first end of the depressable key component being movable between an extended position and a depressed position relative to the first end of the key switch housing with the first end of the depressable key component being closer to the first end of the key switch housing in the depressed position than in the extended position,
a spring element configured to provide a resilient force to resist downward movement of the depressable key component from the extended position to the depressed position, and
variable displacement-sensing circuitry; and
responding to displacement of the depressable key component between the extended position and the depressed position by using the variable displacement-sensing circuitry to detect displacement of the depressable key component relative to the key switch housing, and to provide one or more variable displacement signals that vary in character based on the amount of displacement of the depressable key component between the extended position and the depressed position;
where each of the key switch assemblies further comprises digital signal circuitry, and where the method further comprises using the digital signal circuitry to configured to provide an on/off digital output signal when the depressable key component is depressed downward by a predetermined extent; and
where the method further comprises:
receiving the on/off digital output signal from the digital signal circuitry in a keyboard controller, and using the keyboard controller to process the on/off digital output signal and to provide processed digital key information based on the on/off digital output signal to an external device, and
receiving the variable displacement signals in displacement measurement circuitry, and using the variable displacement signals to determine in real time the relative displacement of the depressable key component between the extended position and the depressed position based on the current character of the provided variable displacement signals.

29. The method of claim 28, further comprising:

executing at least one user application on a host processing device;

using the keyboard controller to process the on/off digital output signal and to provide the processed digital key information based on the on/off digital output signal to the at least one user application executing on the host processing device; and using the displacement measurement circuitry to determine and output a respective processed displacement-based output signal to the host processing device.

* * * * *

UNITED STATES PATENT AND TRADEMARK OFFICE
CERTIFICATE OF CORRECTION

PATENT NO.      : 9,343,248 B2                                Page 1 of 1
APPLICATION NO. : 14/013724
DATED           : May 17, 2016
INVENTOR(S)     : Casparian et al.

It is certified that error appears in the above-identified patent and that said Letters Patent is hereby corrected as shown below:

In the Claims

In claim 19, column 27, line 38, delete "The method" and insert -- The key switch assembly --

Signed and Sealed this
Sixteenth Day of August, 2016

Michelle K. Lee
*Director of the United States Patent and Trademark Office*